(12) United States Patent
Yamada et al.

(10) Patent No.: US 11,257,878 B2
(45) Date of Patent: Feb. 22, 2022

(54) ORGANIC LIGHT EMITTING DEVICE, DISPLAY APPARATUS, PHOTOELECTRIC CONVERSION APPARATUS, ILLUMINATION APPARATUS, AND MOVING OBJECT

(71) Applicant: CANON KABUSHIKI KAISHA, Tokyo (JP)

(72) Inventors: Naoki Yamada, Inagi (JP); Jun Kamatani, Tokyo (JP); Yosuke Nishide, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 140 days.

(21) Appl. No.: 16/684,337

(22) Filed: Nov. 14, 2019

(65) Prior Publication Data
US 2020/0161387 A1  May 21, 2020

(30) Foreign Application Priority Data
Nov. 20, 2018  (JP) .............................. JP2018-217566

(51) Int. Cl.
| | | |
|---|---|---|
| H05B 33/12 | (2006.01) | |
| H01L 27/32 | (2006.01) | |
| H01L 51/50 | (2006.01) | |
| H01L 51/52 | (2006.01) | |
| G03B 13/02 | (2021.01) | |

(Continued)

(52) U.S. Cl.
CPC ........ *H01L 27/3234* (2013.01); *F21S 43/145* (2018.01); *G03B 13/02* (2013.01); *H01L 27/3244* (2013.01); *H01L 51/0072* (2013.01); *H01L 51/5012* (2013.01); *H01L 51/5056* (2013.01); *H01L 51/5072* (2013.01); *H01L 51/52* (2013.01); *H01L 51/5253* (2013.01); *F21W 2103/35* (2018.01); *F21Y 2115/15* (2016.08)

(58) Field of Classification Search
None
See application file for complete search history.

(56) References Cited

U.S. PATENT DOCUMENTS

| | | | | |
|---|---|---|---|---|
| 6,699,594 B1 * | 3/2004 | Ishikawa | ............. | H01L 51/0056 |
| | | | | 313/504 |
| 2001/0028961 A1 * | 10/2001 | Motomatsu | ........... | H01L 51/006 |
| | | | | 428/690 |

(Continued)

FOREIGN PATENT DOCUMENTS

| | | |
|---|---|---|
| JP | 2007-266161 A | 10/2007 |
| JP | 2017-181831 A | 10/2017 |

*Primary Examiner* — Ali Naraghi
(74) *Attorney, Agent, or Firm* — Canon U.S.A., Inc., IP Division

(57) ABSTRACT

An organic light emitting device including a pair of electrodes and an organic compound layer disposed between the pair of electrodes, wherein the organic compound layer contains, in a weight ratio of 50 wt % or more, an organic compound having a glass transition temperature of 130° C. or more, and the organic compound does not have a moiety represented by formula [1] below, $$*{-}{=}{-}*$$  formula [1]

where, in formula [1], *'s represent bonding positions.

17 Claims, 6 Drawing Sheets

(51) Int. Cl.
*F21S 43/145* (2018.01)
*H01L 51/00* (2006.01)
*F21Y 115/15* (2016.01)
*F21W 103/35* (2018.01)

(56) References Cited

U.S. PATENT DOCUMENTS

2006/0063034 A1\* 3/2006 Chen .................. C07D 405/10
                                                                                         428/690
2017/0088719 A1\* 3/2017 Alsayed ............... C08K 5/3432
2017/0092874 A1\* 3/2017 Tanabe ................ H01L 51/0071

\* cited by examiner

US 11,257,878 B2

ORGANIC LIGHT EMITTING DEVICE, DISPLAY APPARATUS, PHOTOELECTRIC CONVERSION APPARATUS, ILLUMINATION APPARATUS, AND MOVING OBJECT

BACKGROUND

Field of the Invention

The present disclosure relates to an organic light emitting device, a display apparatus, a photoelectric conversion apparatus, an illumination apparatus, and a moving object.

Description of the Related Art

In recent years, intensive research and development has been performed for full-color light emitting arrays including organic light emitting devices. Such a full-color light emitting array is produced so as to have a configuration in which different light emitting layers of organic light emitting devices are individually formed for pixels, so that the pixels individually provide different emission colors, or a configuration in which the light emitting layers of organic light emitting devices are formed so as to emit white light, and red, green, and blue color filters are individually formed for pixels. The former configuration may be referred to as the side-by-side configuration, and the latter configuration may be referred to as the color filter configuration.

The color filters used for organic light emitting devices are roughly divided into on-chip color filters that are color filters formed on organic light emitting devices, and on-glass color filters that are color filters formed on separate glass substrates and subsequently bonded to organic light emitting devices.

On-glass color filters are affected by alignment accuracy for bonding positions and crosstalk due to the thickness of adhesive layers, and hence are not suitable for achieving an increase in the resolution. By contrast, in the case of on-chip color filters, color filter layers are directly formed on organic light emitting device regions, and hence tend not to be affected by alignment accuracy or crosstalk due to the thickness of adhesive layers. With the trend toward an increase in the resolution of display apparatuses, display apparatuses are often produced with on-chip color filters in order to reduce misalignment between such an organic light emitting device and color filters.

Japanese Patent Laid-Open No. 2017-181831 (hereinafter PTL1) describes an organic light emitting device including on-chip color filters. Japanese Patent Laid-Open No. 2007-266161 (hereinafter PTL2) describes a white-light emitting device in which, from the anode side, red, green, and blue light emitting layers are stacked, and the organic layers are formed so as to have glass transition temperatures (Tg) of 150° C. or more, so that the device has higher durability at high temperatures.

In the case of organic light emitting devices including on-chip color filters, during the patterning step for on-chip color filters, irradiation with light at high energy for performing photolithography may cause photodeterioration of the organic compounds. In addition, annealing during the step of forming color filter films may cause thermal deterioration of the organic compounds. When such deteriorations occur, the organic light emitting devices may have lower efficiency, higher voltage, or lower durability.

SUMMARY

The present disclosure provides an organic light emitting device that has good device characteristics even in spite of having been subjected to the on-chip color filter formation step.

An embodiment of the present disclosure provides an organic light emitting device including a pair of electrodes and an organic compound layer disposed between the pair of electrodes, wherein the organic compound layer contains, in a weight ratio of 50 wt % or more, an organic compound having a glass transition temperature of 130° C. or more, and the organic compound does not include a chemical structure represented by formula [1] below, $$*\mathrm{-\!\!=\!\!-}*\quad\text{formula [1]}$$

where, in formula [1], *'s represent bonding positions.

Further features of the present disclosure will become apparent from the following description of exemplary embodiments with reference to the attached drawings.

DESCRIPTION OF THE EMBODIMENTS

Figure 1:
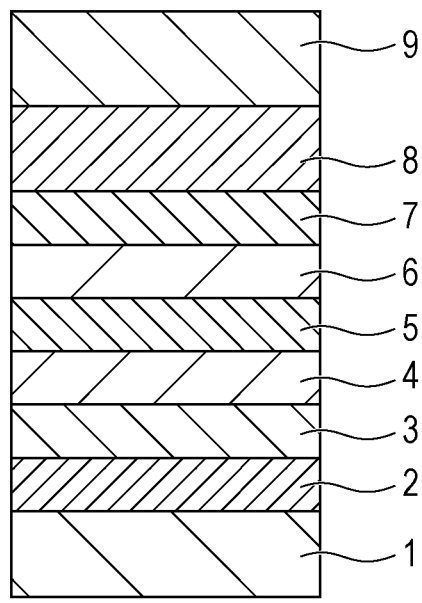
FIG. 1 is a schematic sectional view illustrating an example of an organic light emitting device according to an embodiment of the present disclosure.

An organic light emitting device according to an embodiment of the present disclosure includes a pair of electrodes and an organic compound layer disposed between the pair of electrodes, wherein the organic compound layer contains, in a weight ratio of 50 wt % or more, an organic compound having a glass transition temperature of 130° C. or more, and the organic compound does not include a chemical structure represented by a general formula [1] described later.

When the organic compound layer is constituted by a hole transport layer, a light emitting layer, and an electron transport layer, and these layers have glass transition temperatures of 130° C. or more, an organic light emitting device having high heat resistance is provided. For example, the layers subjected to annealing in the color filter formation step do not undergo morphological changes such as crystallization, and are maintained as stable amorphous films. With the amorphous films being maintained, good light emitting characteristics can be exhibited.

The glass transition temperature of the organic compound layer can be regarded as the glass transition temperature of an organic compound contained in a weight ratio of 50 wt % or more in the organic compound layer. The glass transition temperatures of other organic compounds contained in small amounts as dopants in the organic compound layer do not considerably affect the glass transition temperature of the organic compound layer. Thus, in order to obtain an organic light emitting device having high heat resistance, materials individually contained, in weight ratios of 50 wt % or more, in the hole transport layer, the light emitting layer, and the electron transport layer preferably have glass transition temperatures of 130° C. or more; more preferably, materials individually contained, in weight ratios of 80 wt % or more, in the hole transport layer, the light emitting layer, and the electron transport layer, have glass transition temperatures of 130° C. or more.

The hole transport layer also encompasses, for example, a layer having, in addition to the hole transport function, another function such as an electron blocking function, namely an electron blocking layer.

The electron transport layer also encompasses, for example, a layer having, in addition to the electron transport function, another function such as a hole blocking function, namely a hole blocking layer.

A hole injection layer or electron injection layer, which has a function of causing injection from an electrode, exerts the function without the form of an amorphous film. Thus, the material of such a layer needs not to have a glass transition temperature of 130° C. or more.

In this Specification, a carrier transport layer between the anode and the light emitting layer or a carrier transport layer between the cathode and the light emitting layer is referred to as a charge transport layer.

An organic light emitting device according to an embodiment of the present disclosure can have the following features:
(1) the organic compound layer contains, in a weight ratio of 50 wt % or more, an organic compound having a glass transition temperature of 130° C. or more; and
(2) the organic compound does not include a moiety represented by a general formula [1] described later.

These features provide an organic light emitting device having high operation durability. Hereinafter, these features will be described.
(1) The Feature that the Organic Compound Layer Contains, in a Weight Ratio of 50 wt % or More, an Organic Compound Having a Glass Transition Temperature of 130° C. or more In the case of forming on-chip color filters on an organic light emitting device, the organic light emitting device is subjected to, for example, photolithography and baking for curing the resins of color filters and the like. At this time, heating at the glass transition temperature or higher causes molecular movements within the organic compound layer, which may result in morphological changes such as migration, association, or aggregation of molecules. As a result, the amorphous film is crystallized, which results in degradation of characteristics such as no emission from the organic light emitting device due to leakage current within the organic light emitting device, and a decrease in the light emission efficiency due to aggregation of the light emitting material. In order that the organic compound contained in the organic light emitting device is not degraded to lose the function due to optical energy of photolithography and thermal energy of baking, the organic compound preferably has a glass transition temperature of 130° C. or more, more preferably 140° C. or more.

The glass transition temperature indicates the temperature at which the compound undergoes a morphological change. It is known that organic light emitting devices are used within temperature ranges not higher than the glass transition temperatures of the organic compounds used in the devices. Thus, when an organic light emitting device contains an organic compound having a low glass transition temperature, the on-chip color filter formation step is performed in a narrower allowable temperature range, so that the formation step is not sufficiently performed. Alternatively, the organic compound is heated at the glass transition temperature or higher, so that the organic compound is thermally affected, and device characteristics may be degraded. In summary, the feature that the organic compound has a glass transition temperature of 130° C. or more means that the organic compound contained in the organic light emitting device is an organic compound that can withstand the on-chip color filter formation step.

The glass transition temperature in this Specification is a value determined by measuring the powder of material with a differential scanning calorimetry (DSC) instrument. There are known methods of measuring glass transition temperature: a method in which, during heating a sample from a low temperature to a high temperature, the glass transition temperature is measured; and a method in which a sample is heated from a low temperature to a high temperature and rapidly cooled to an amorphous state, and the glass transition temperature is measured while the sample is again heated from a low temperature to a high temperature. When a DSC instrument cannot be used, any of the above-described methods can be used to measure glass transition temperature.

(2) The Feature that the Organic Compound does not Include a Moiety Represented by the Following General Formula [1]

The organic compound has another feature of, for withstanding the on-chip color filter step, not including the moiety represented by the following general formula [1].

General formula [1]

In the general formula [1], *'s represent bonding positions. Specifically, the general formula [1] represents a vinylene group as a moiety. When the organic compound includes the vinylene group as a moiety, application of optical energy or the like may cause an intermolecular reaction of the organic compound. For example, the organic compound may be photopolymerized into polymer to lose the function.

When on-chip color filters are formed on the organic light emitting device, the organic compound layer of the organic light emitting device is exposed to optical energy of photolithography or thermal energy of baking. In order that the organic compound is not affected by optical energy during the color filter formation step, the organic compound is selected so as not to have the vinylene group structure represented by the general formula [1].

Upon exposure to optical energy during irradiation with light or the like, the vinylene group undergoes a dimer-forming reaction. As a result, light emitting materials having vinylene groups are known to lose the light emitting capabilities. Similarly, hole transport materials and electron transport materials having vinylene groups upon irradiation with light also undergo a dimer-forming reaction to lose the carrier transport capabilities.

The following is an example of the dimer-forming reaction caused by irradiating a compound having a vinylene group with light.

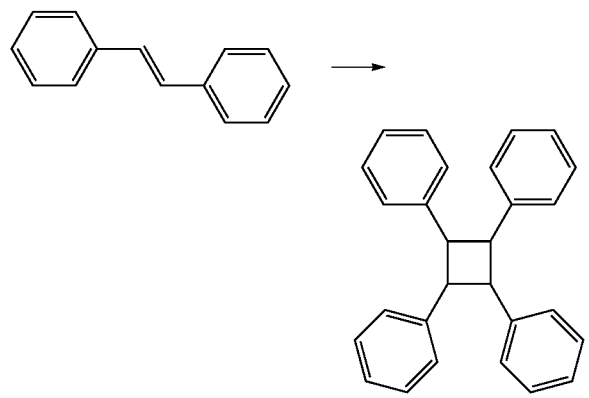

The following is an example of a reaction between a compound having a vinylene group and an aromatic compound.

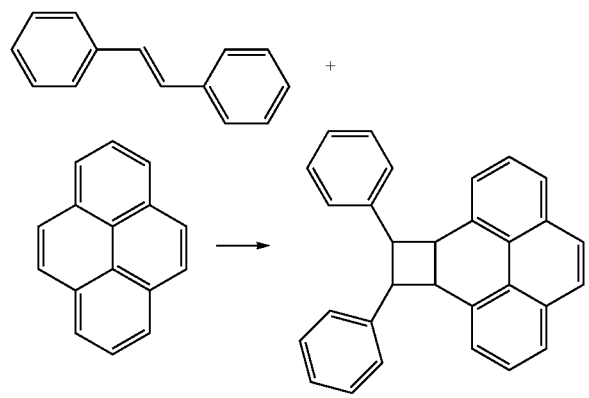

This reaction is caused upon irradiation with light to form a dimer of the vinylene group, to form a cyclobutane ring. When this reaction occurs in the organic compound layer of an organic light emitting device, for example, the dimer product reacts with another organic compound to form a reaction product, so that the reaction affects not only the compound having a vinylene group, but also other compounds. More specifically, the reaction results in degradation of device characteristics, such as loss of the light emitting capabilities of the light emitting material or loss of transport capabilities of the carrier transport material.

The cyclobutane ring generated in the reaction example is an unstable compound. Thus, the cyclobutane ring is decomposed by passing current for a long time. The decomposition product may quench excitons emitting light.

When the vinylene group represented by the above-described general formula [1] has cis and trans isomers, it may take any of the cis form and the trans form.

An organic light emitting device according to an embodiment of the present disclosure can have, in addition to the above-described two features, the following features:

(3) the feature that the light emitting layer is in contact with a layer including an organic compound having a glass transition temperature of 135° C. or more;

(4) the feature that the organic compound layer is a multi-layered body, and, in the multilayered body, an organic compound layer having the largest thickness includes an organic compound having a glass transition temperature of 135° C. or more;

(5) the feature that the light emitting layer is composed of a non-amine organic compound alone; and (6) the feature that the light emitting layer includes, in a weight ratio of less than 50 wt %, an organic compound having a glass transition temperature of 135° C. or more.

Hereinafter, these features will be described.

(3) The Feature that the Light Emitting Layer is in Contact with a Layer Including an Organic Compound Having a Glass Transition Temperature of 135° C. or more When the organic compound layer includes a light emitting layer and a layer in contact with the light emitting layer, the layer in contact with the light emitting layer can include an organic compound having a glass transition temperature of 135° C. or more. When an organic compound layer undergoes a morphological change, this change may affect a layer in contact with the organic compound layer. Specifically, when the layer in contact with the light emitting layer undergoes a morphological change, this change may affect the light emitting layer. The light emitting layer considerably contributing to light emission of the organic light emitting device desirably does not undergo morphological changes. For this reason, not only the light emitting layer, but also the layer in contact with the light emitting layer can include an organic compound having a glass transition temperature of 135° C. or more. This enables suppression of morphological changes of the layer in contact with the light emitting layer.

(4) The Feature that the Organic Compound Layer is a Multilayered Body, and, in the Multilayered Body, an Organic Compound Layer Having the Largest Thickness Includes an Organic Compound Having a Glass Transition Temperature of 135° C. or more Among the layers constituting the organic compound layer, when a layer having the largest thickness undergoes a morphological change, this change tends to affect other layers. For this reason, among the layers constituting the organic compound layer, the layer having the largest thickness can be composed of a material having a glass transition temperature of 135° C. or more.

(5) The Feature that the Light Emitting Layer is Composed of a Non-Amine Organic Compound Alone The material forming the light emitting layer can be a compound that does not have bonds having low bond stability in the molecular structure. Such bonds having low bond stability mean bonds having a bond energy of about 3.9 eV. Compounds having bonds having a low bond energy in the molecular structure may undergo breaking of bonds upon irradiation with light, resulting in decomposition.

Such a molecular structure having low bond stability will be described with reference to the following compounds A-1, A-2, and B-1 as examples. A-1 is a structure referred to as arylamine A-2 is a carbazolyl group having a phenyl group. This structure is considered as a structure in which the two phenyl groups of A-1 have linked together to form the ring, hence regarded as having an amino group. In these examples, bonds having low bond stability are the bond linking together the carbazole ring and the phenyl group, and the bond linking together the amino group and the phenyl group (nitrogen-carbon bonds). Referring to Compound B-1, the bond linking together carbon and carbon (carbon-carbon bond) has high bond stability. As described below, the nitrogen-carbon bonds have a bond energy of 3.9 eV, whereas the carbon-carbon bond has a bond energy of 5.0 eV. This indicates that the carbon-carbon bond has high bond stability.

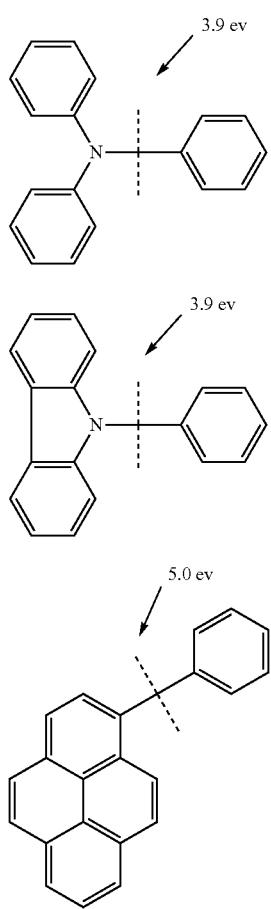

Thus, the material forming the light emitting layer can have a non-amine structure not including amino groups. However, "not including amino groups" is different from "not including nitrogen atoms". The non-amine structure does not exclude substituents having a nitrogen atom and having high bond stability. Examples of the substituents include a cyano group, a pyridyl group, a pyrimidinyl group, a triazinyl group, and a quinolinyl group.

The structure is more preferably a hydrocarbon structure composed of one or a plurality of aryl groups, still more preferably a compound having a substituent that is a hydrogen atom, an alkyl group, an aryl group, a heterocyclic group, or a cyano group. More preferably, the substituent is an aromatic hydrocarbon.

Non-limiting examples of the aryl group include a phenyl group, a naphthyl group, an indenyl group, a biphenyl group, a terphenyl group, a fluorenyl group, a pyrenyl group, a perylenyl group, a fluoranthenyl group, a phenanthryl group, a triphenylenyl group, and condensed structures of two or more of the foregoing.

Non-limiting examples of the alkyl group include a methyl group, an ethyl group, a normal propyl group, an isopropyl group, a normal butyl group, a tertiary butyl group, a secondary butyl group, an octyl group, a cyclohexyl group, a 1-adamantyl group, and a 2-adamantyl group.

Non-limiting examples of the heterocyclic group include a pyridyl group, an oxazolyl group, an oxadiazolyl group, a thiazolyl group, a thiadiazolyl group, a carbazolyl group, an acridinyl group, a phenanthrolyl group, a dibenzofuranyl group, and a dibenzothiophenyl group.

Incidentally, molecular orbital method calculation was performed by Density Functional Theory (DFT), which is currently widely used. As the functional, B3LYP was employed. As the basis function, 6-31G* was employed. The molecular orbital method calculation was performed with Gaussian 09 (Gaussian 09, Revision C. 01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford Conn., 2010.), which is currently widely used.

Configuration of Organic Light Emitting Device According to One Embodiment of the Present Disclosure An organic light emitting device according to an embodiment of the present disclosure is an organic device including a pair of electrodes and an organic compound layer disposed between the pair of electrodes. Regarding the emission color, the organic light emitting device may be configured to emit light of any one of the three primary colors, or white light.

FIG. 1 is a schematic sectional view of an organic light emitting device according to an embodiment of the present disclosure. On a substrate 1, the following are formed in this order: an anode 2, a hole transport layer 3, a light emitting layer 4, an electron transport layer 5, a cathode 6, a sealing layer 7, a planarization layer 8, and a color filter 9. FIG. 1 illustrates a mere example, and the organic light emitting device may include other layers.

Substrate

In the organic light emitting device according to this embodiment, the substrate may be a Si substrate, a glass substrate, or a resin substrate. In the case of employing the Si substrate, transistors may be formed in the Si itself to provide a microdisplay apparatus. In the case of employing the glass substrate, TFTs may be formed to provide a display apparatus. The resin substrate may also be referred to as a flexible substrate. In the case of employing the flexible substrate, a foldable or rollable display apparatus may be provided. The substrate may or may not transmit light unless it blocks light emitted from the light emitting device.

Electrodes

In this embodiment, the first electrode is an anode, and the second electrode is a cathode. Alternatively, the first electrode may be a cathode, and the second electrode may be an anode. When light is extracted from the second electrode-side of the light emitting device, the first electrode may be provided as a reflective electrode.

In the organic light emitting device according to this embodiment, the first electrode can be formed of a metal material having a reflectance of 80% or more. Specific examples of the metal material include metals such as Al and Ag, and alloys of such metals containing, for example, Si, Cu, Ni, Nd, or Ti. Examples of the alloys include AgMg, AlCu, and TiN. The reflectance means the reflectance at the wavelength of light emitted from the light emitting layer. The reflective electrode may have, on its light-extraction-side surface, a barrier layer. Examples of the material for the barrier layer include metals such as Ti, W, Mo, and Au and alloys of the metals. These alloys may encompass the above-described alloys.

In the organic light emitting device according to this embodiment, the second electrode may be a semi-transmissive reflective layer that has properties of transmitting a portion of light incident on the surface and reflecting another portion (namely, semi-transmissive reflectivity). The upper electrode is formed of, for example, an elemental metal such as magnesium or silver, an alloy containing, as the main component, magnesium or silver, or an alloy material containing an alkali metal or an alkaline-earth metal.

When the second electrode is formed of an alloy, the alloy may be an alloy of magnesium and silver. In such a case of employing the alloy of magnesium and silver, the alloy may have a magnesium-silver content ratio of 1:1, or the content in atom % of one of magnesium and silver may be higher than that of the other. When the content in atom % of one of magnesium and silver is made higher than that of the other, the one may be silver. When the silver content in atom % is made higher, the second electrode has high transmittance. Alternatively, when the content in atom % of one of magnesium and silver is made higher than that of the other, the one may be magnesium. When the magnesium content in atom % is made higher, the second electrode has good film properties and is less likely to be cut. The second electrode may have a multilayered configuration as long as it has a desired transmittance.

Organic Compound Layer

The organic compound layer according to this embodiment may be formed as a common layer for a plurality of organic light emitting devices. The common layer means that it is disposed over a plurality of organic light emitting devices. The common layer can be formed by performing, for the whole surface of the substrate, a coating process such as spin coating or a vapor deposition process.

The organic compound layer according to this embodiment at least includes a light emitting layer, and can be constituted by a plurality of layers. The plurality of layers are, for example, a hole injection layer, a hole transport layer, an electron blocking layer, a light emitting layer, a hole blocking layer, an electron transport layer, and an electron injection layer. Each organic compound layer may be composed of a plurality of materials. In this case, the materials may satisfy a weight ratio of 1:1 to 4. In the organic compound layer, a hole injected from the anode and an electron injected from the cathode are recombined in the light emitting layer, to emit light.

The light emitting layer may be constituted by a plurality of layers; the light emitting layers may individually contain a red light emitting material, a green light emitting material, and a blue light emitting material; and these emission colors are mixed to thereby emit white light. Alternatively, the light emitting layers may individually contain light emitting materials that emit light of complementary colors, such as a blue light emitting material and a yellow light emitting material, to thereby emit white light. The light emitting layer may be constituted by two layers, three layers, or more layers. A plurality of light emitting layers may individually emit light of different colors. A light emitting layer may emit light of color the same as that of light emitted from another light emitting layer.

When a plurality of light emitting layers, for example, a first light emitting layer and a second light emitting layer emit white light, the organic light emitting device may have, on its light emission side, color filters. The white emission light may be combined with color filters, to obtain desired emission colors such as RGB.

Hereinafter, specific examples of the electron transport material used for an organic light emitting device according to an embodiment of the present disclosure will be described. The electron transport material can be freely selected from materials that can transport, to the light emitting layer, electrons injected from the cathode, and is selected in accordance with, for example, a balance relative to the hole mobility of the hole transport material. Examples of the material having an electron transport capability include oxadiazol derivatives, oxazole derivatives, pyrazine derivatives, triazole derivatives, triazine derivatives, quinoline derivatives, quinoxaline derivatives, phenanthroline derivatives, organoaluminum complexes, and condensed ring compounds (such as fluorene derivatives, naphthalene derivatives, chrysen derivatives, and anthracene derivatives). Such electron transport materials can also be used for a hole blocking layer.

The following are specific examples, but are obviously not limited thereto, of the compound used as the electron transport material.

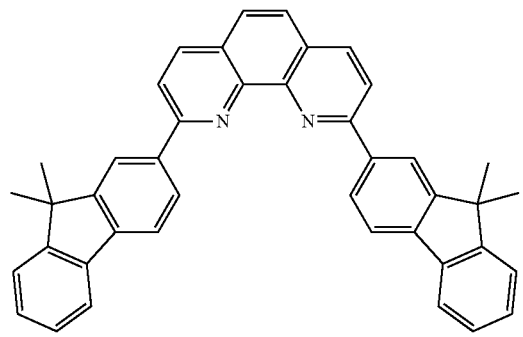

ET1

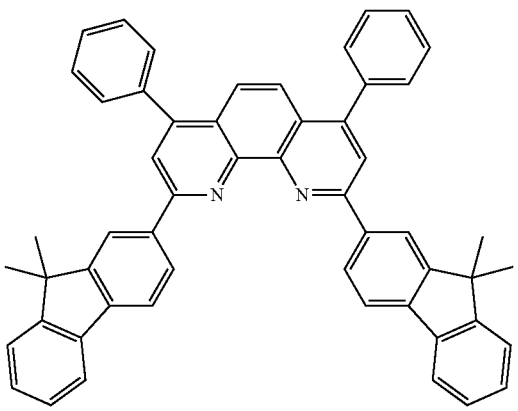

ET2

-continued
ET3
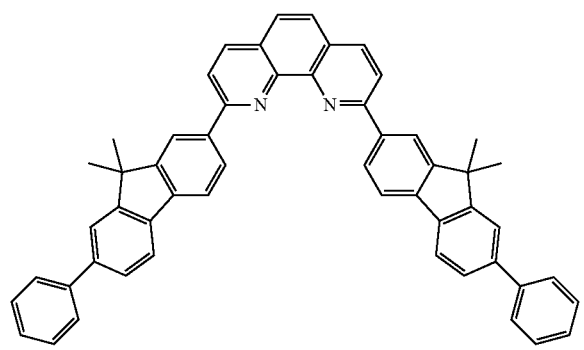
ET4
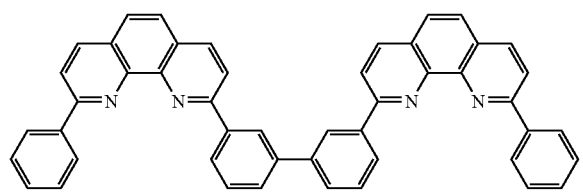
ET5
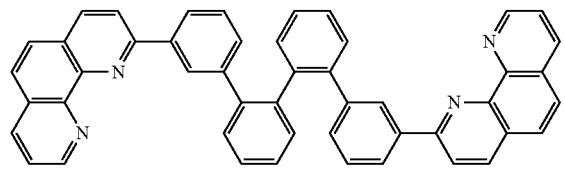
ET6
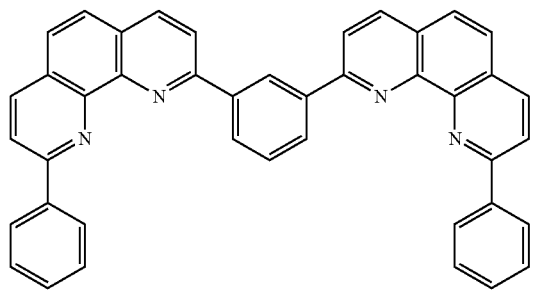
ET7
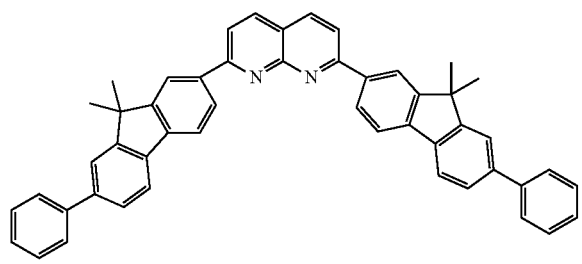
ET8
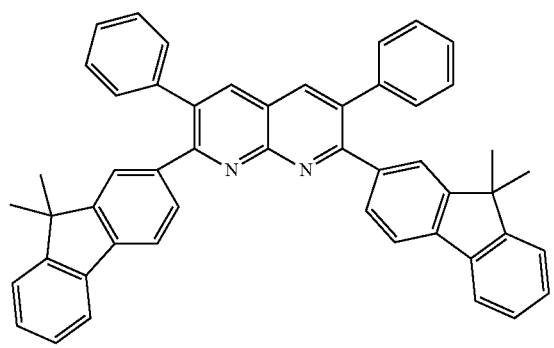
ET9
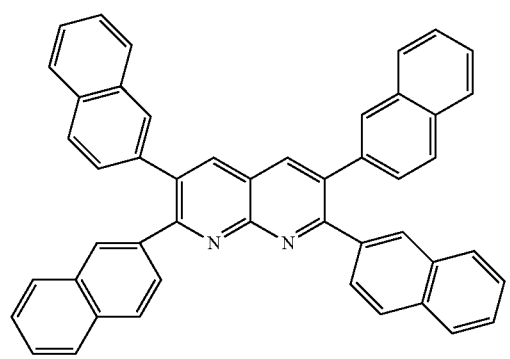
ET10
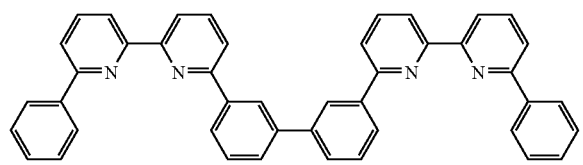

-continued
ET11
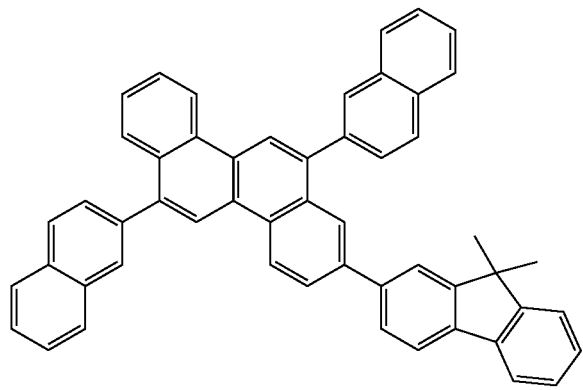
ET12
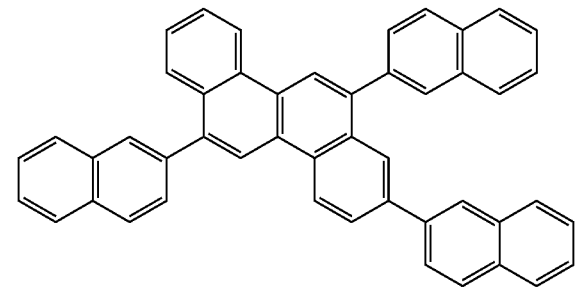
ET13
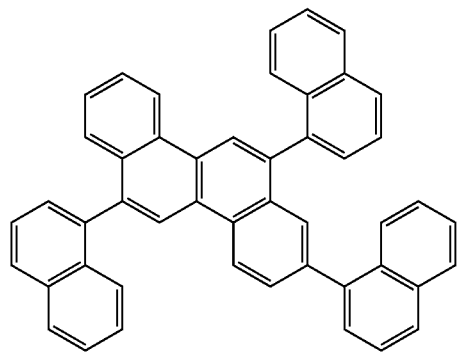
ET14
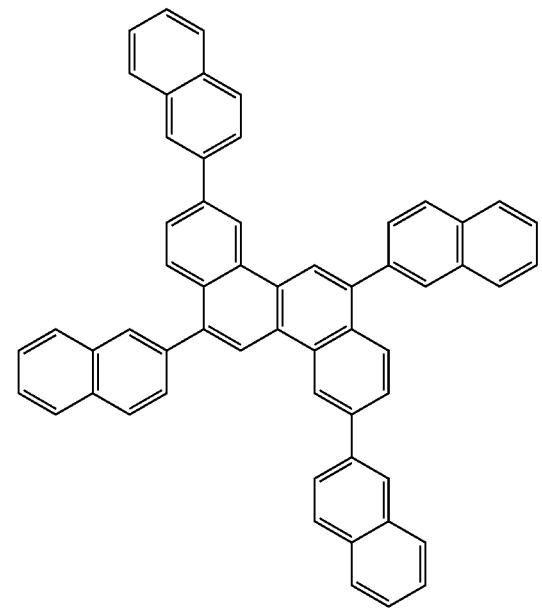
ET15
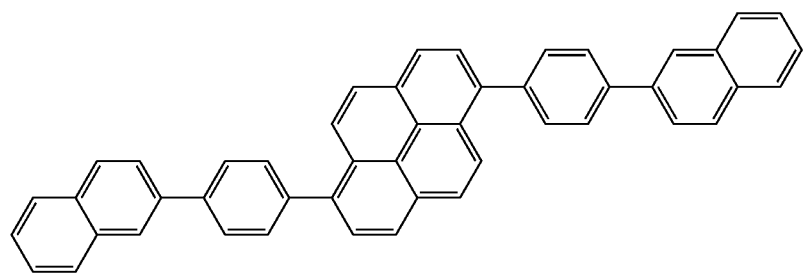
ET16
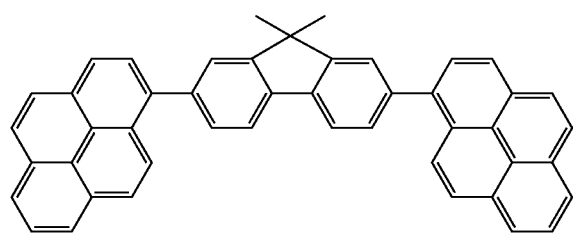
ET17
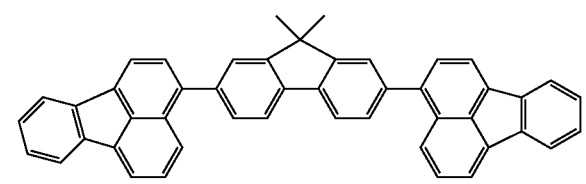

-continued
ET18
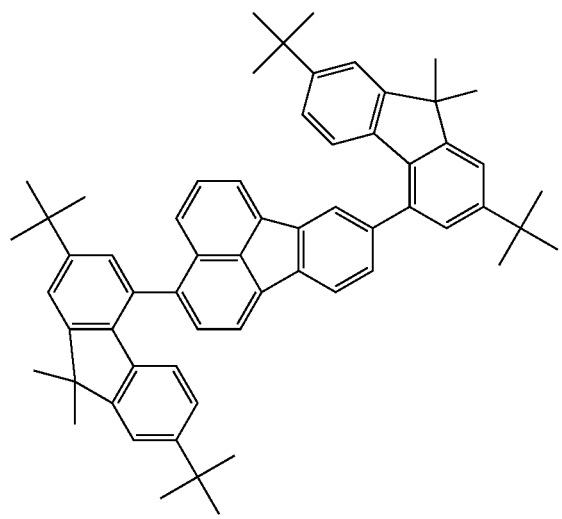
ET19
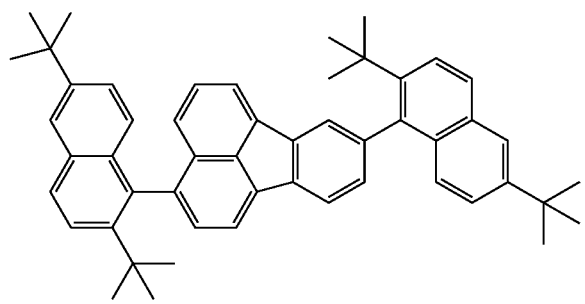
ET20
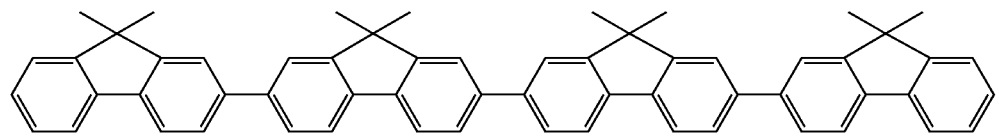
ET21
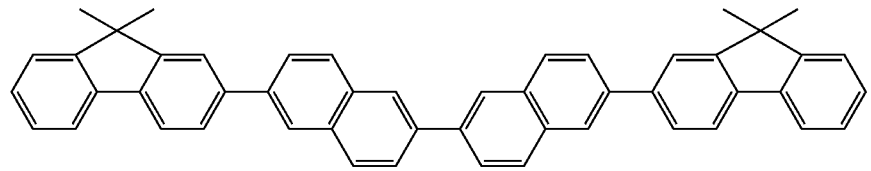
ET22
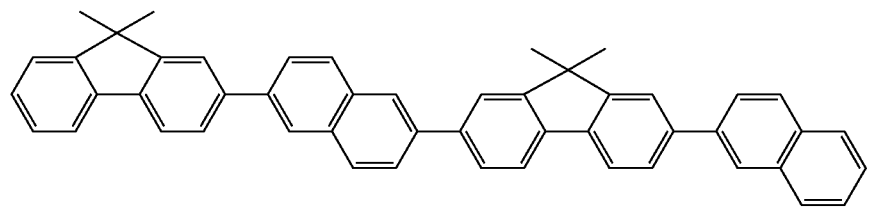
ET23
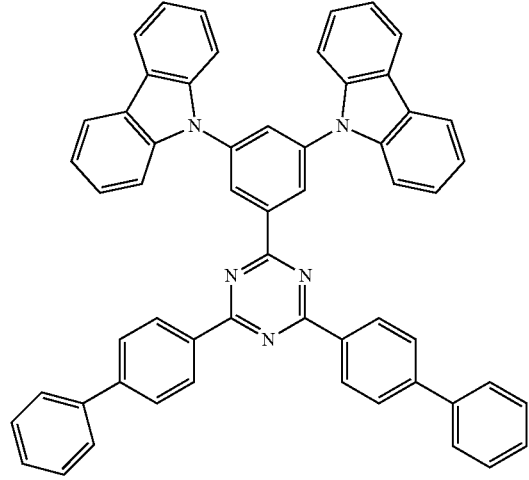
ET24
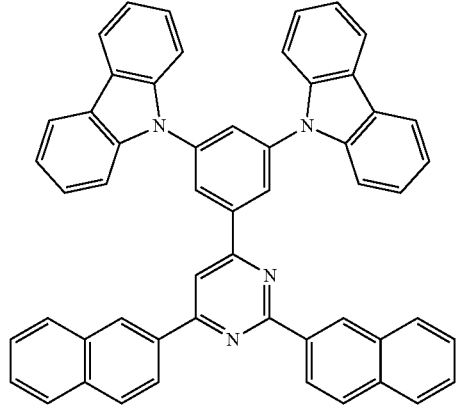

Hereinafter, specific examples of the hole transport material used for an organic light emitting device according to an embodiment of the present disclosure will be described. The hole injection transport material can be a material that facilitates hole injection from the anode, or a material having high hole mobility in order to transport injected holes to the light emitting layer. Examples of low-molecular-weight or high-molecular-weight materials having a hole injection transport capability include triarylamine derivatives, aryl-carbazole derivatives, phenylenediamine derivatives, stilbene derivatives, phthalocyanine derivatives, porphyrin derivatives, poly(vinylcarbazole), poly(thiophene), and other conductive polymers. Such hole injection transport materials can also be used for the electron blocking layer.

The following are specific examples, but are obviously not limited thereto, of the compound used as the hole injection transport material.

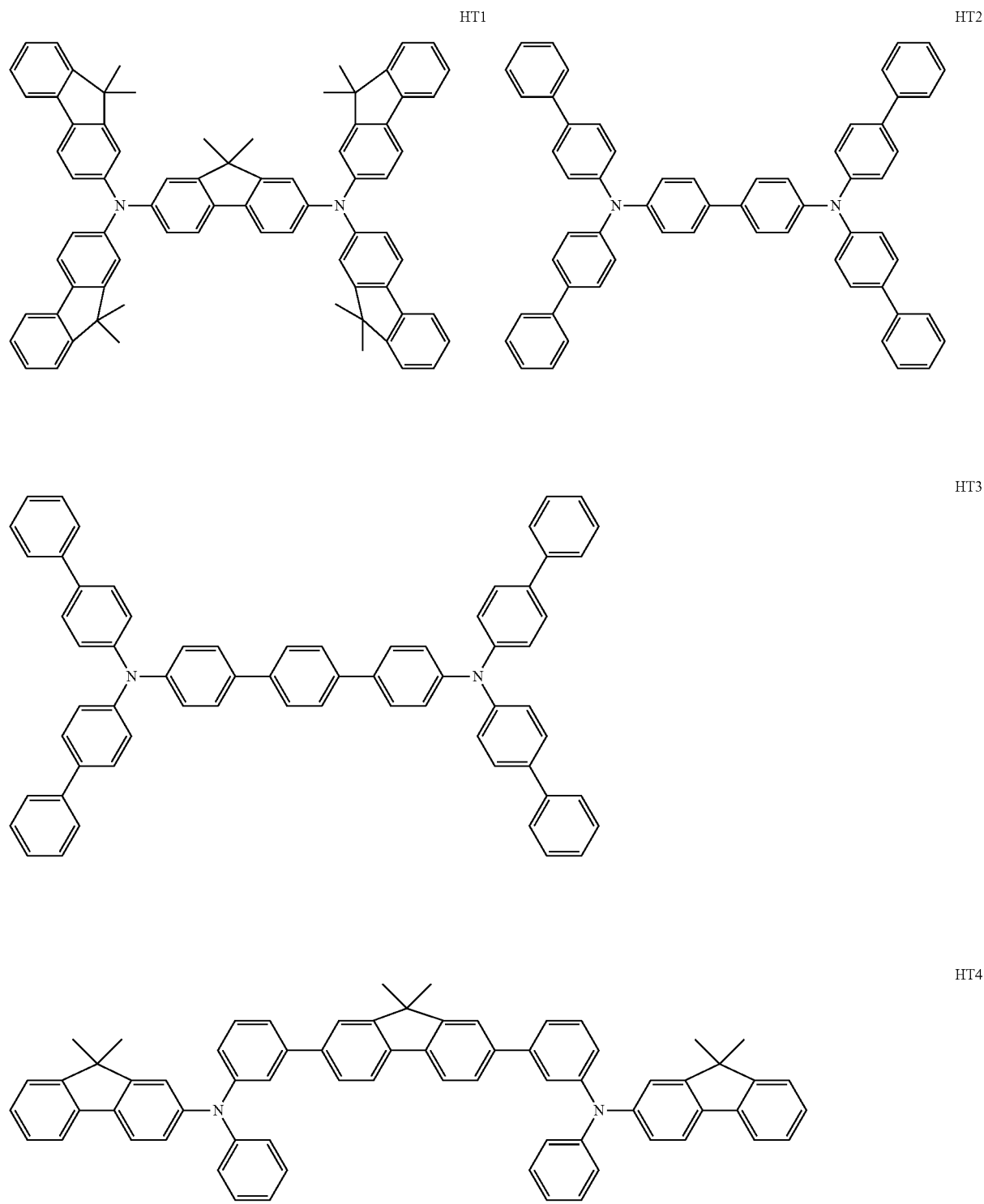

-continued
HT5
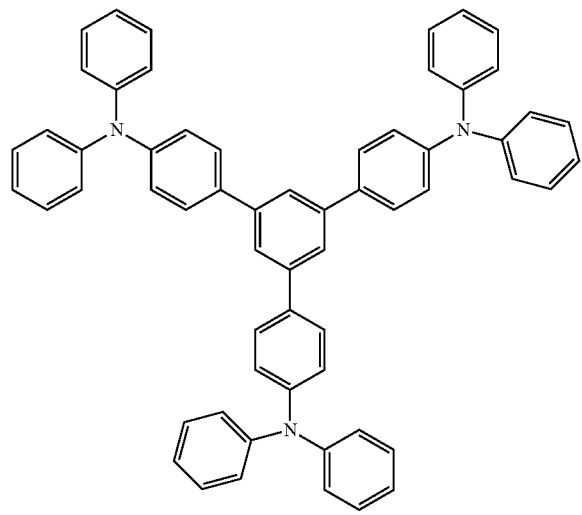
HT6
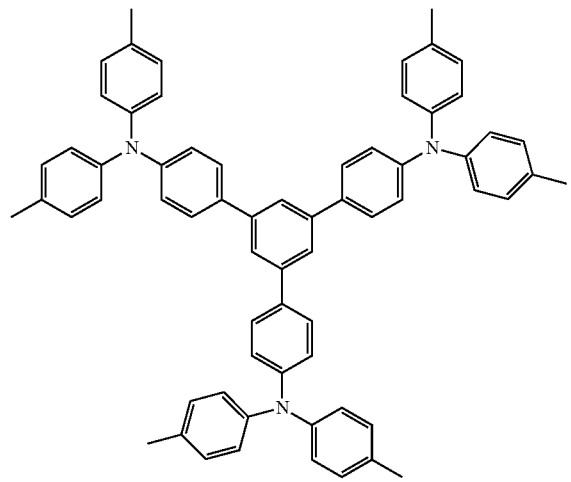
HT7
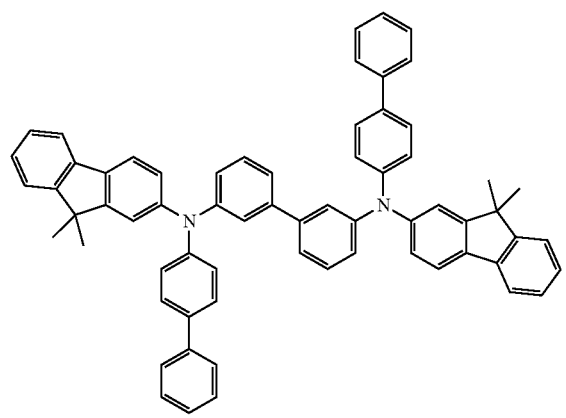
HT8
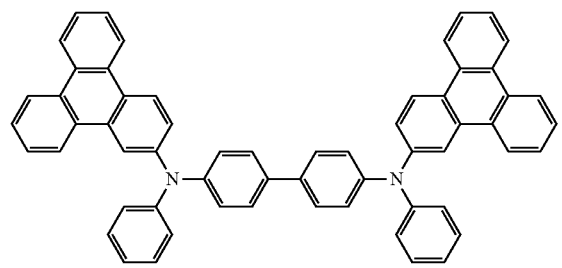
HT9
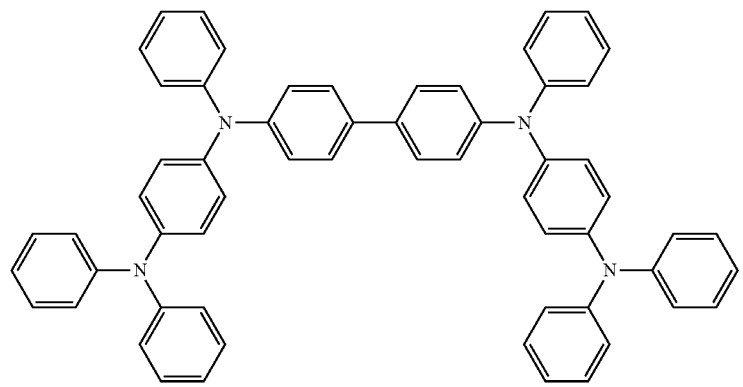

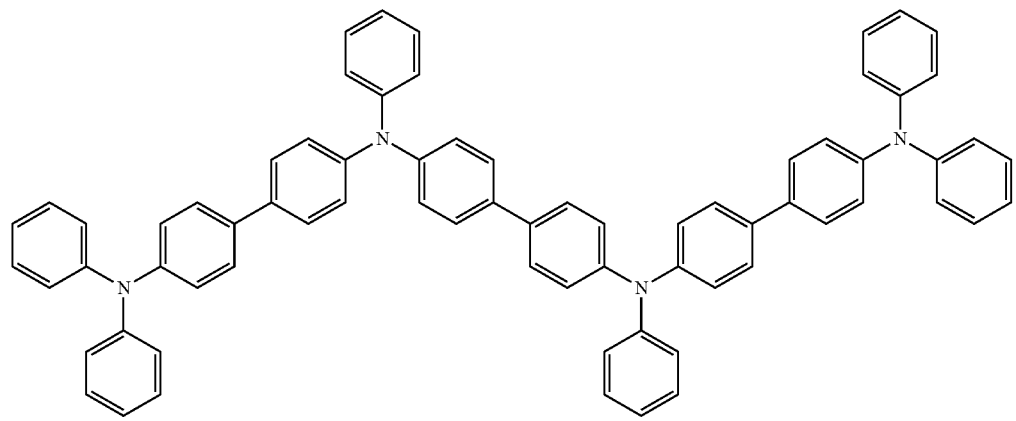
HT10
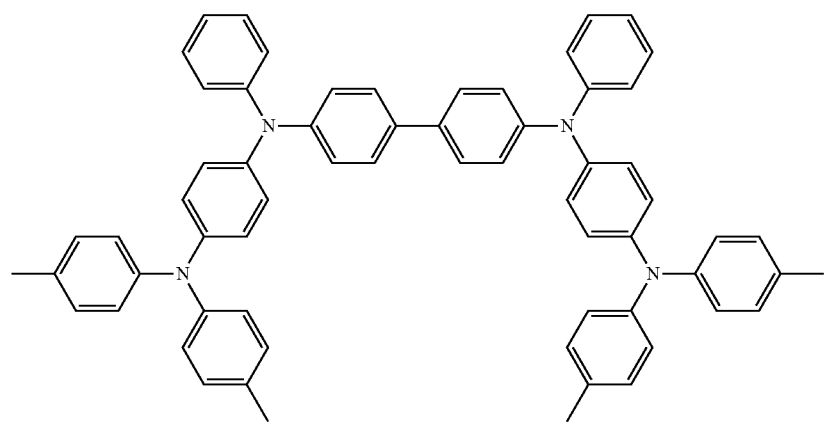
HT11
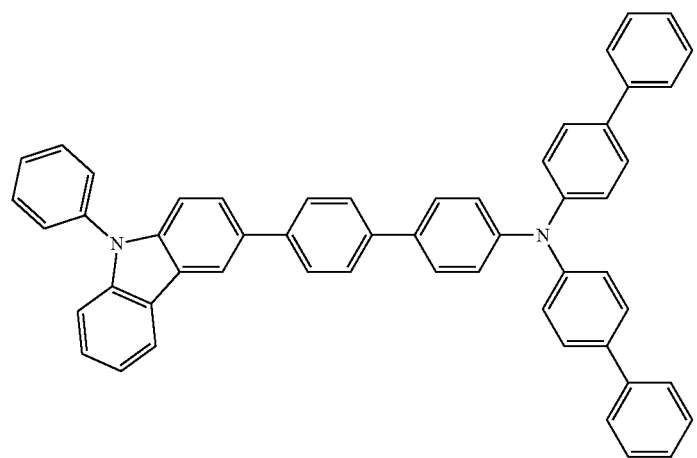
HT12

-continued
HT13
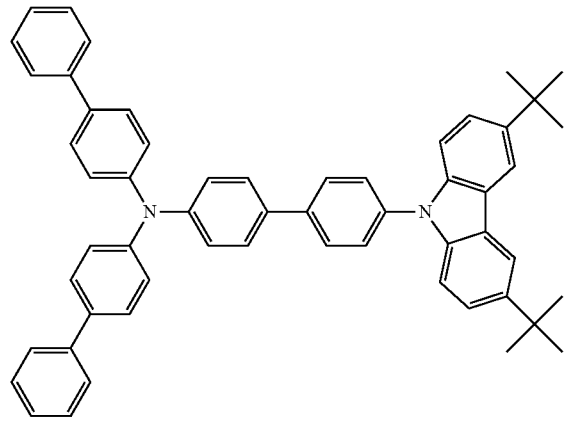
HT14
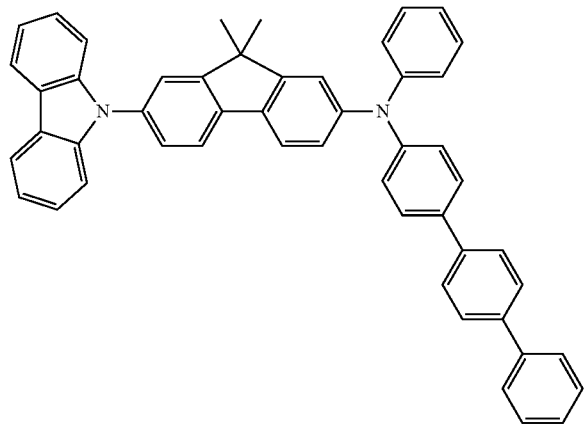
HT15
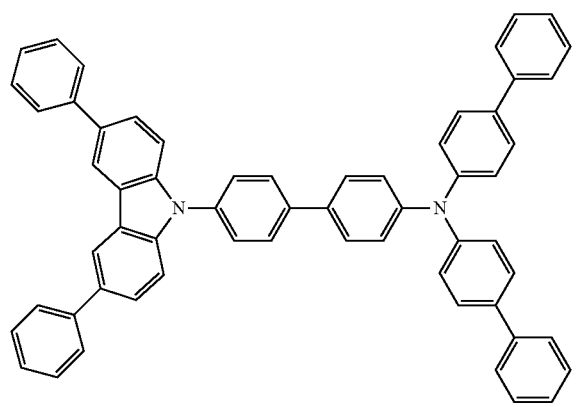
HT16
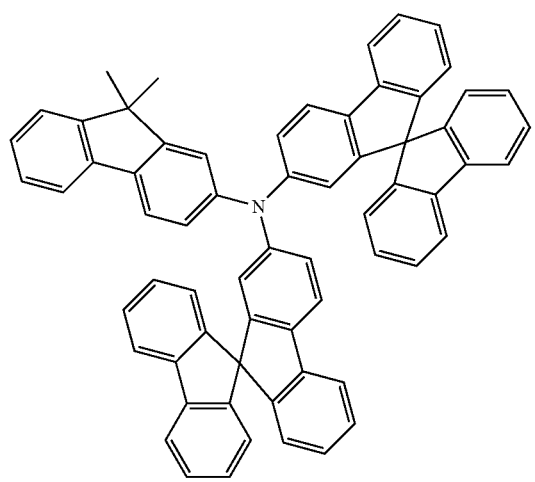
HT17
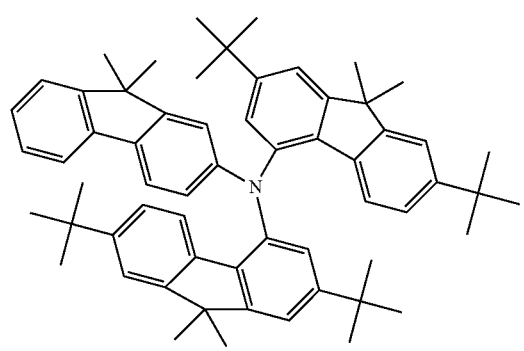
HT18
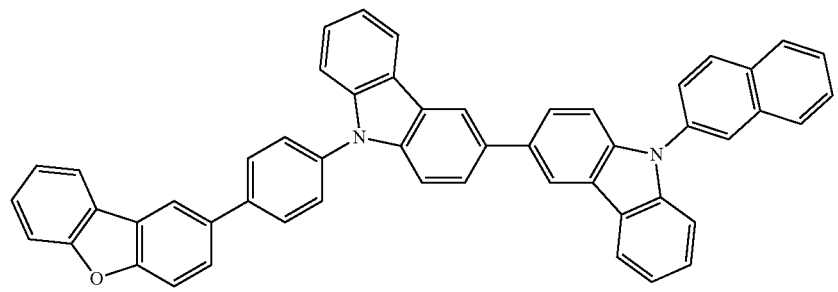

Hereinafter, specific examples of the light emission material used for an organic light emitting device according to an embodiment of the present disclosure will be described. Examples of the light emission material mainly contributing to the light emission function include condensed ring compounds (such as fluorene derivatives, naphthalene derivatives, pyrene derivatives, perylene derivatives, tetracene derivatives, anthracene derivatives, and rubrene), quinacridone derivatives, coumarin derivatives, stilbene derivatives, organoaluminum complexes such as tris(8-quinolinolate) aluminum, iridium complexes, platinum complexes, rhenium complexes, copper complexes, europium complexes, ruthenium complexes, and polymer derivatives such as poly(phenylene vinylene) derivatives, poly(fluorene) derivatives, and poly(phenylene) derivatives.

Examples of a light-emitting-layer host or light emission assist material contained in the light emitting layer include the above-described compounds, derivatives thereof, carbazole derivatives, dibenzofuran derivatives, dibenzothiophene derivatives, organoaluminum complexes such as tris(8-quinolinolate) aluminum, and organoberyllium complexes.

The following are specific examples of the light-emitting-layer host material used for the present disclosure. However, these compounds are mere specific examples, and the present disclosure is not limited to these compounds.

EMH1

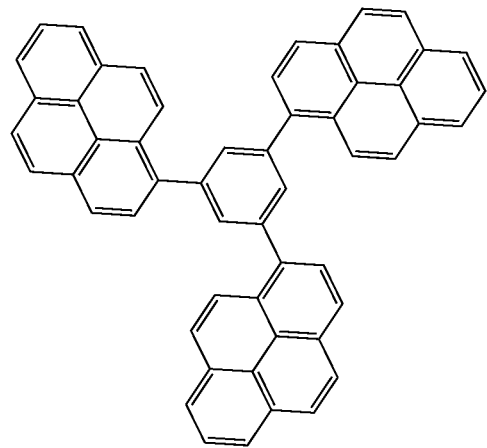

EMH2

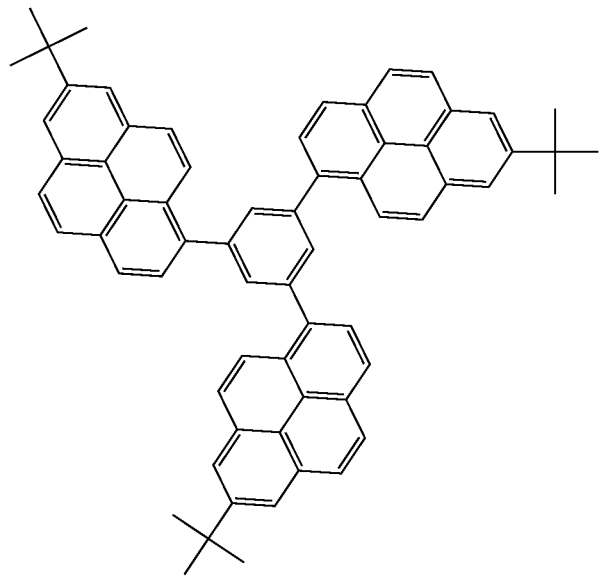

EMH3

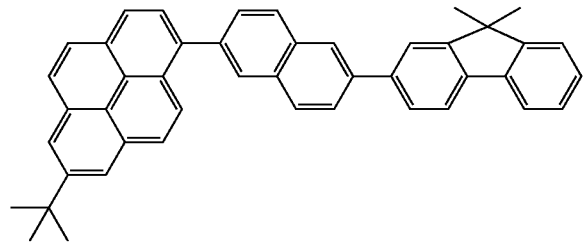

EMH4

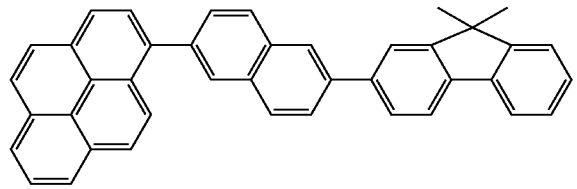

EMH5

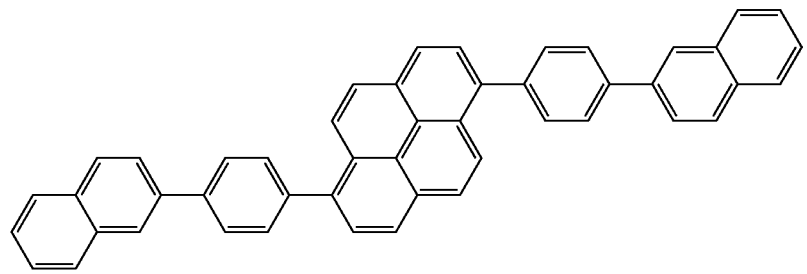

-continued
EMH6
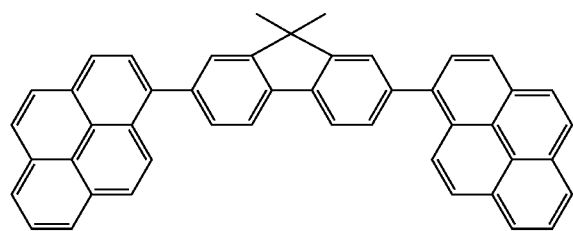
EMH7
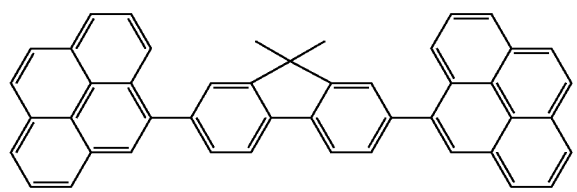
EMH8
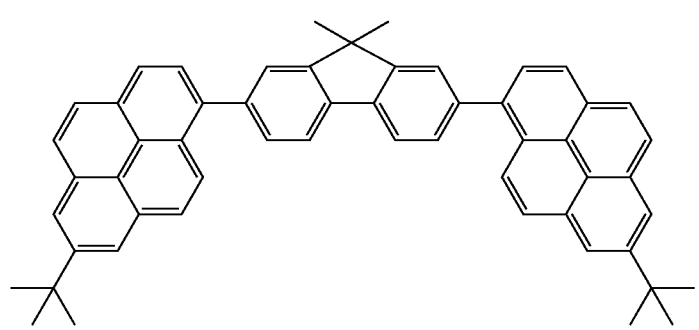
EMH9
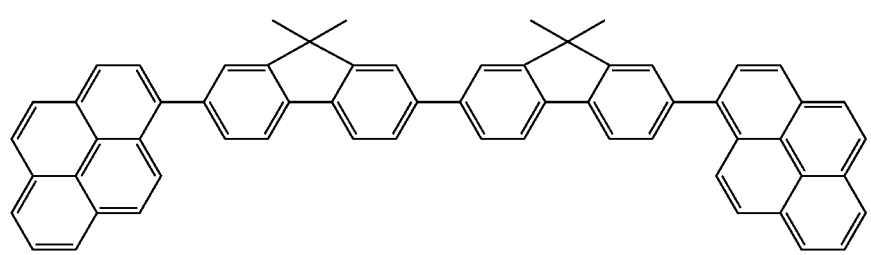
EMH10
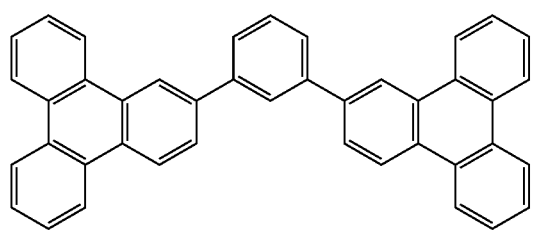
EMH11
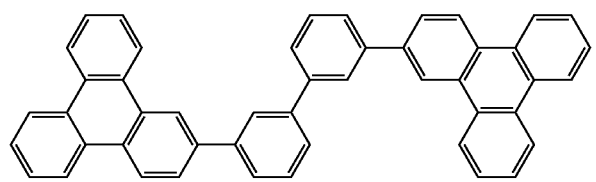
EMH12
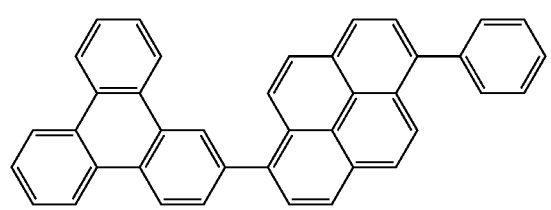
EMH13
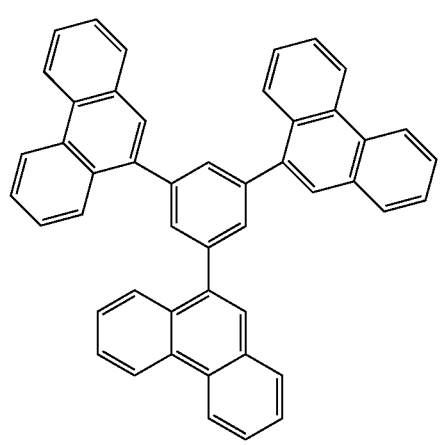

-continued
EMH14
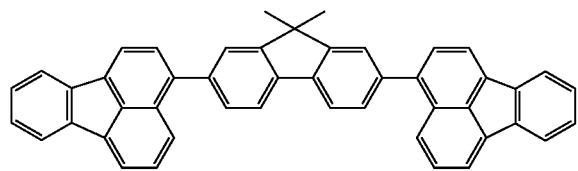
EMH15
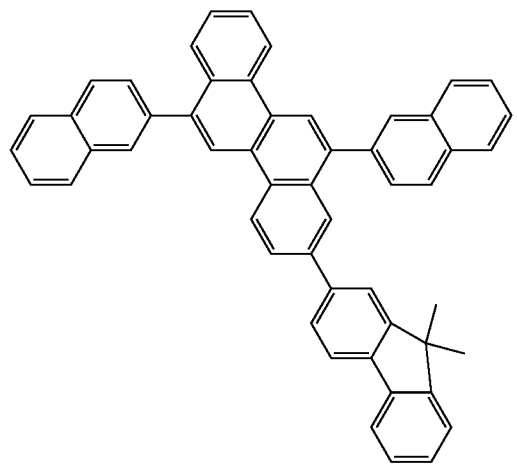
EMH16
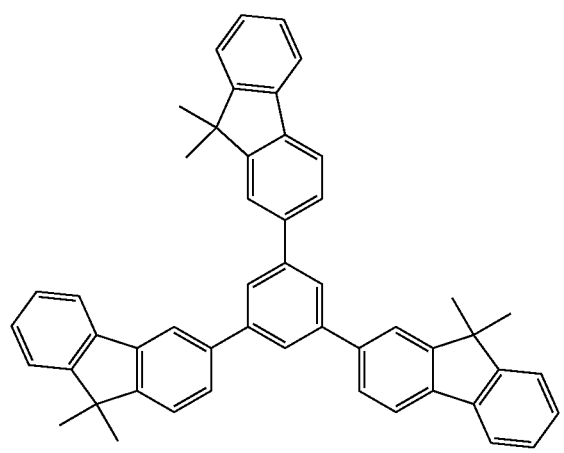
EMH17
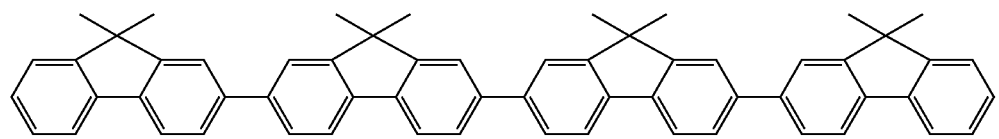
EMH18
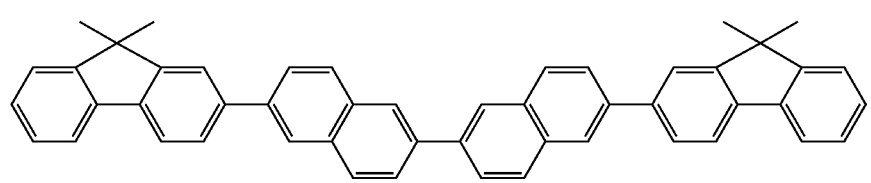
EMH19
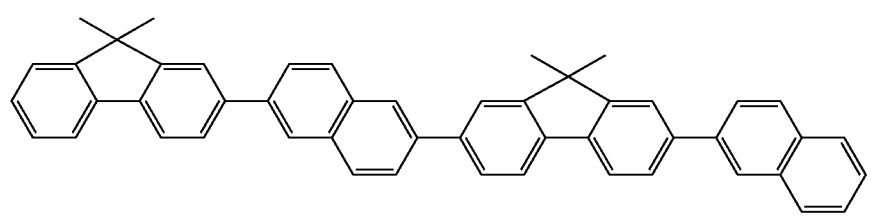

-continued
EMH20
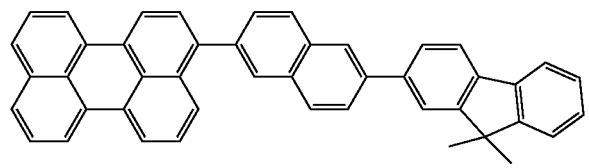
EMH21
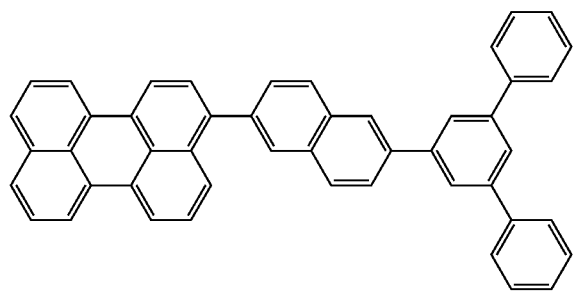
EMH22
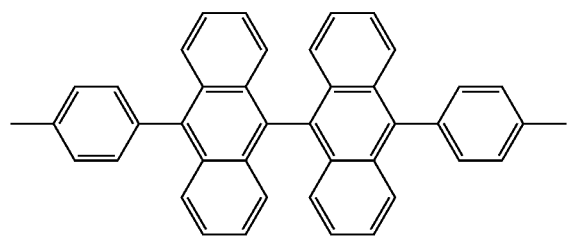
EMH23
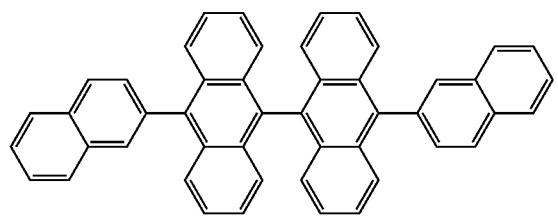
EMH24
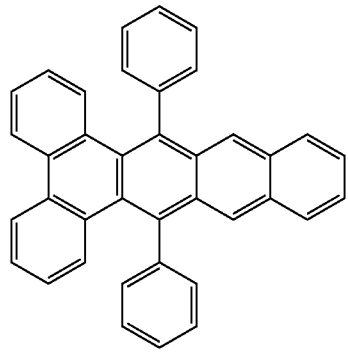
EMH25
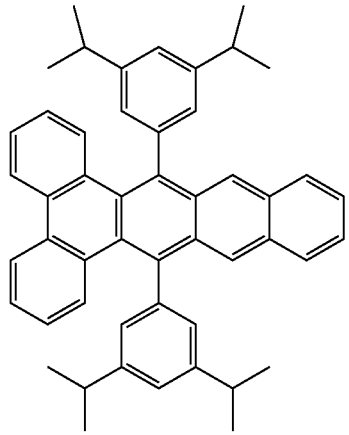
EMH26
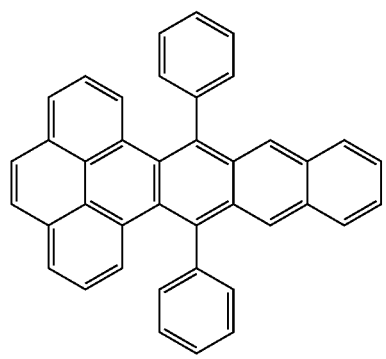
EMH27
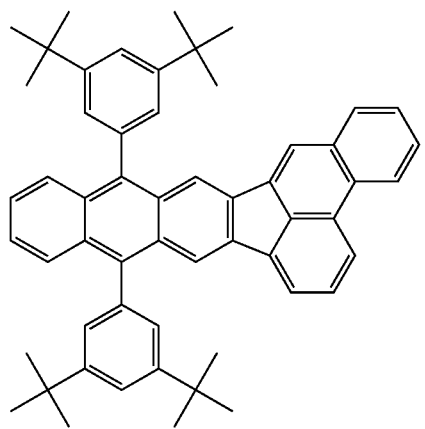

-continued

EMH28
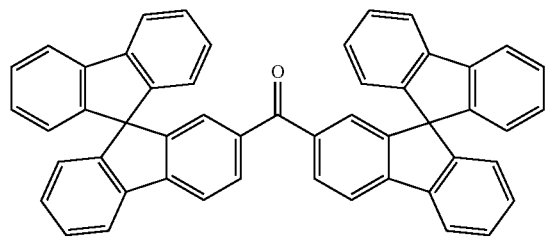

EMH29
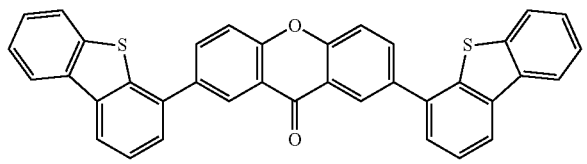

EMH30
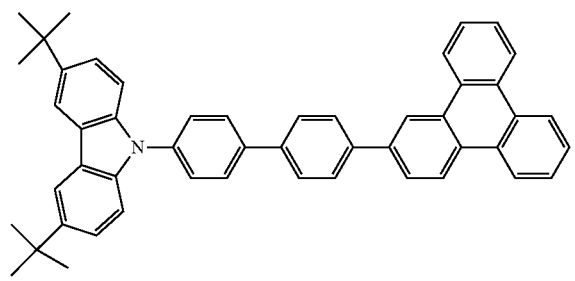

EMH31
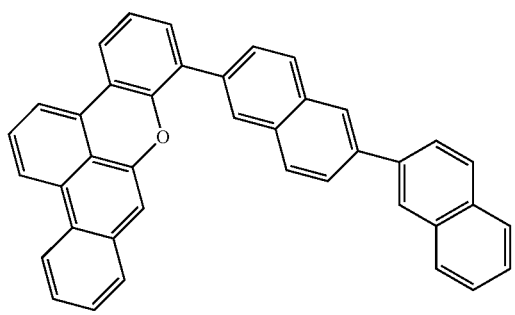

Among the host materials listed as examples, from the above-described viewpoint of bond stability, preferred are EMH1 to EMH27, which are composed of hydrocarbons alone, more preferred are EMH1 to EMH21, which do not include acene structures such as anthracene and tetracene. This is because use of such host materials provides organic light emitting devices having high durability.

The following are examples of a blue dopant used for an organic light emitting device according to an embodiment of the present disclosure. However, the present disclosure is not limited to these examples.

BD1
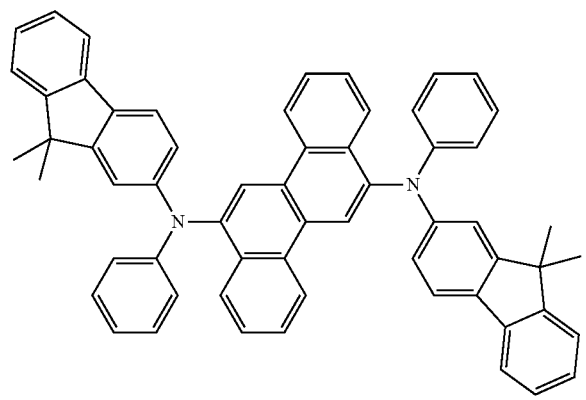

BD2
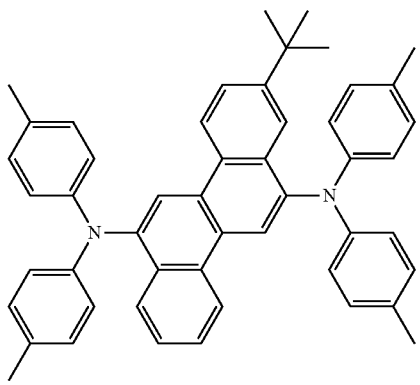

BD3
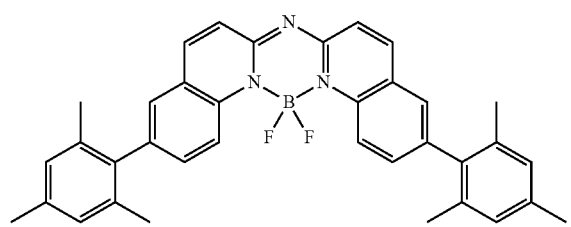

BD4
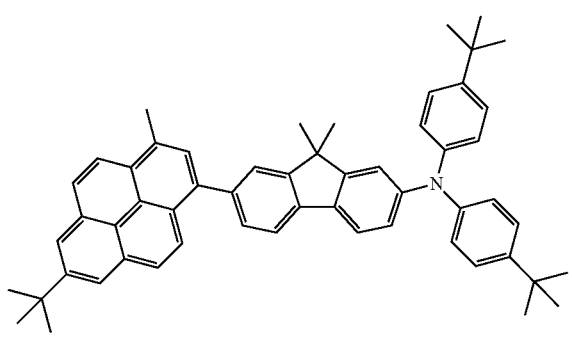

-continued
BD5
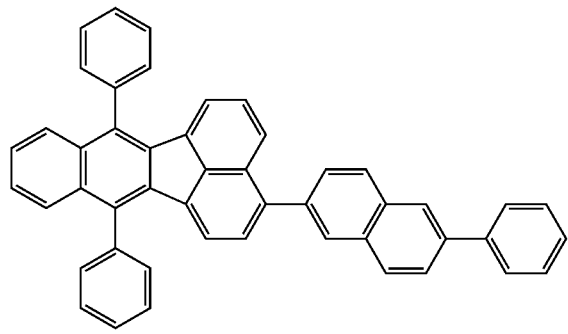
BD6
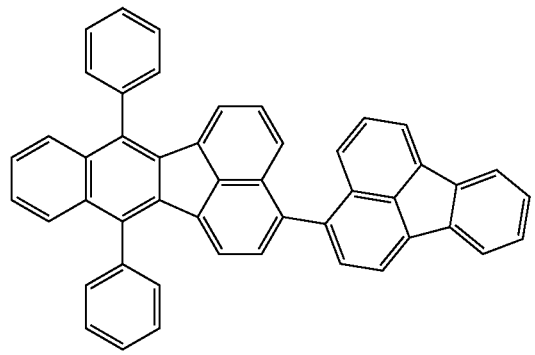
BD7
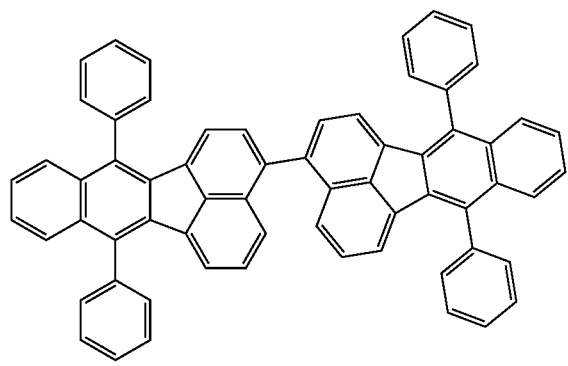
BD8
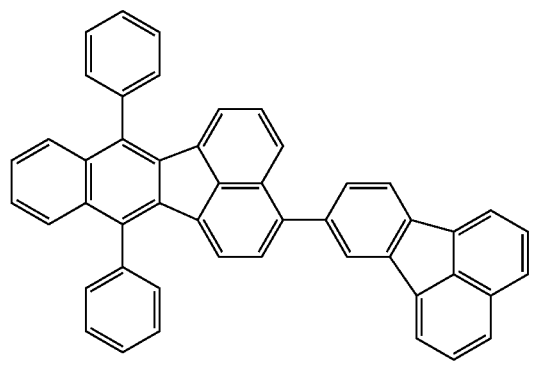
BD9
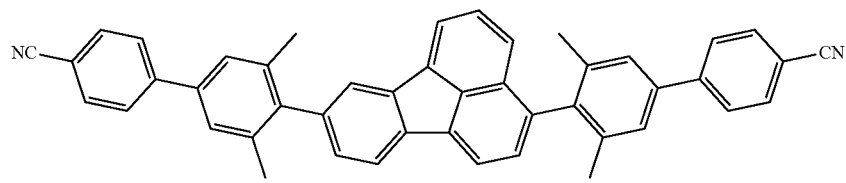
BD10
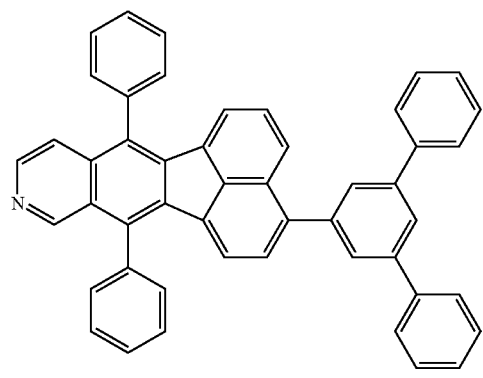
BD11
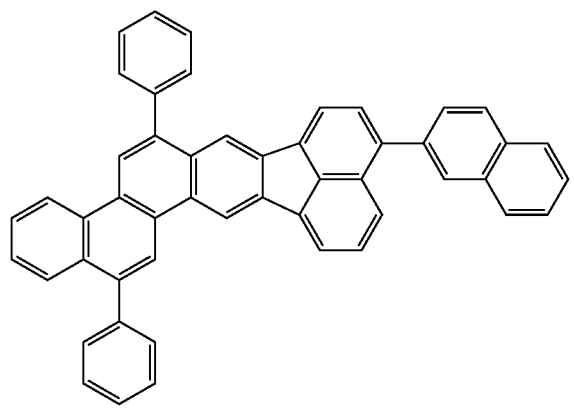

-continued
BD12
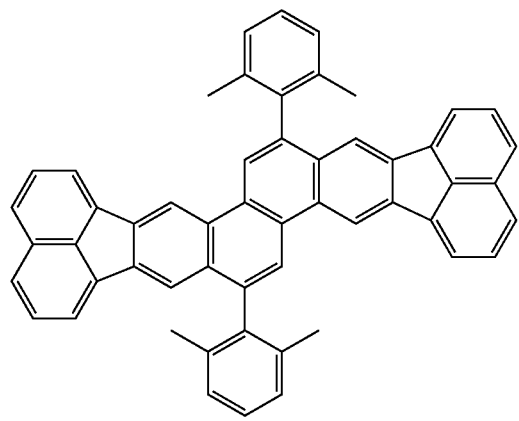
BD13
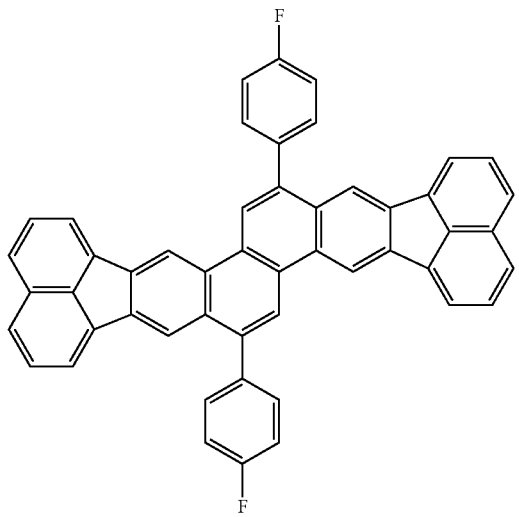
BD14
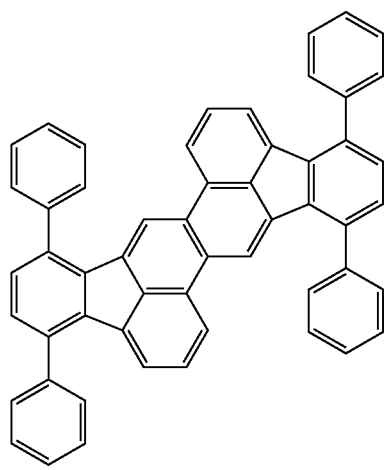
BD15
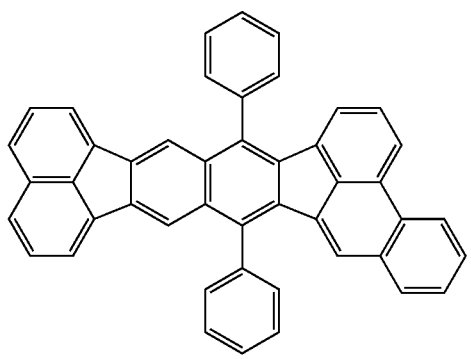
BD16
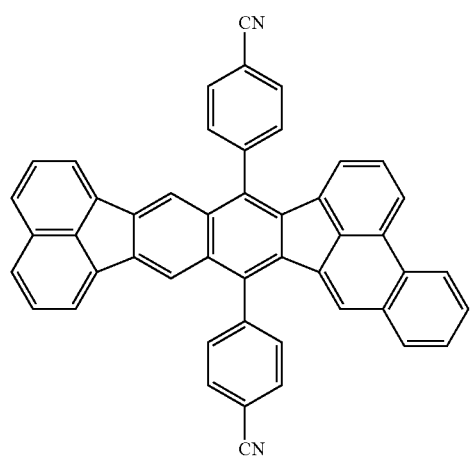
BD17
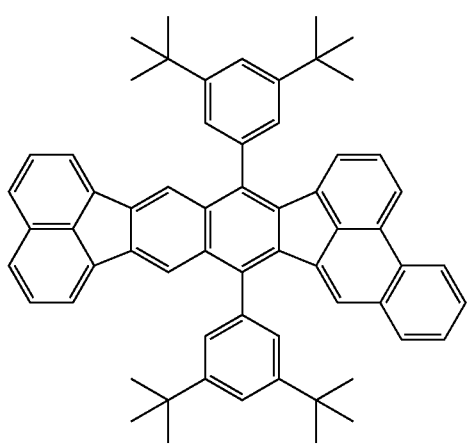

-continued
BD18
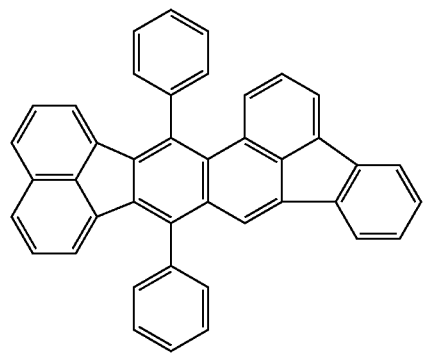
BD19
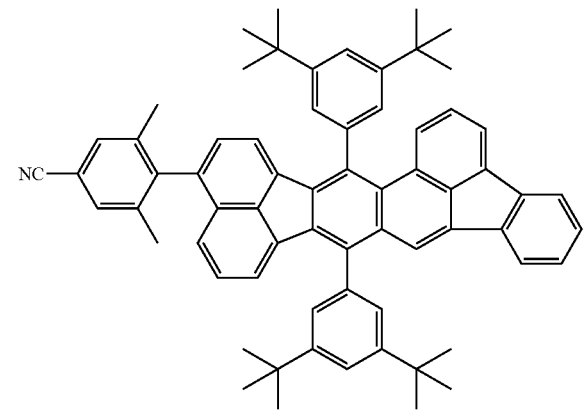
BD20
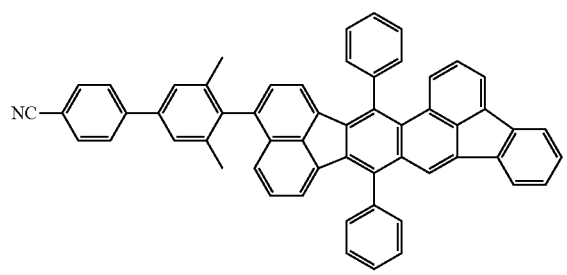
BD21
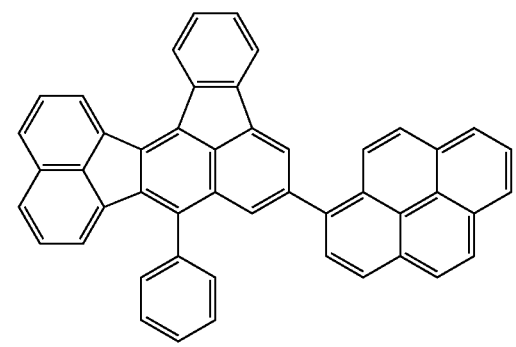
BD22
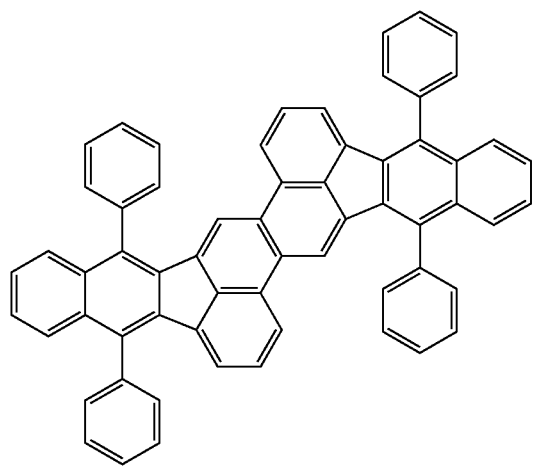
BD23
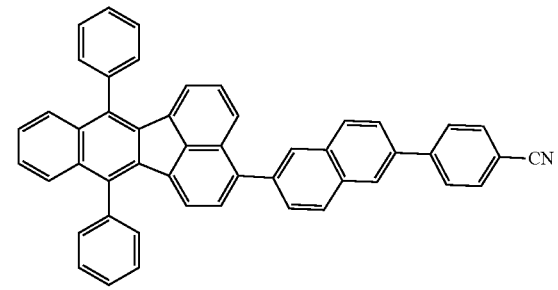
BD24
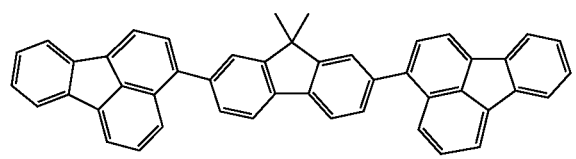
BD25
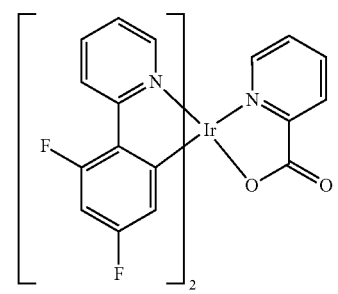

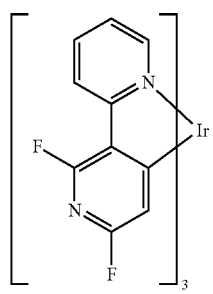
BD26

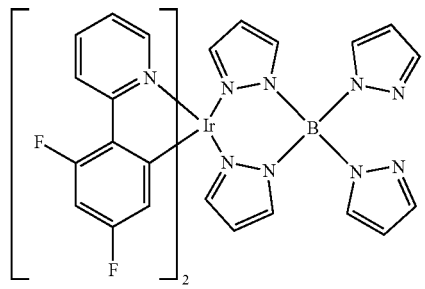
BD27

Among the blue dopants listed as examples, blue dopants not having substituted amino groups having low bond energy can be employed. The doping concentration using such a blue dopant is preferably 0.1 to 10.0 wt %, more preferably 0.3 to 5.0 wt %. When the concentration is set to satisfy such a range, the electron trapping capability and the recombination probability become well-balanced. This enables suppression of concentration quenching and a decrease in the luminance, and provides good light emitting characteristics.

The following are examples of a green dopant used for an organic light emitting device according to an embodiment of the present disclosure. However, the present disclosure is not limited to these examples.

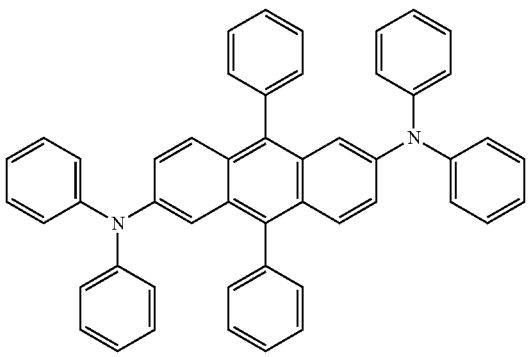
GD3

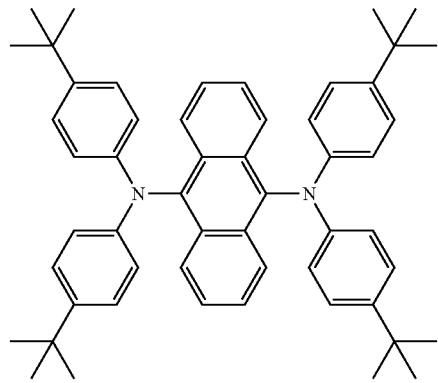
GD1

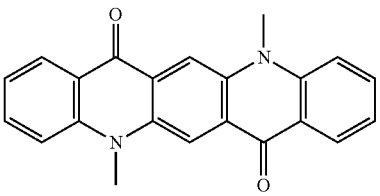
GD4

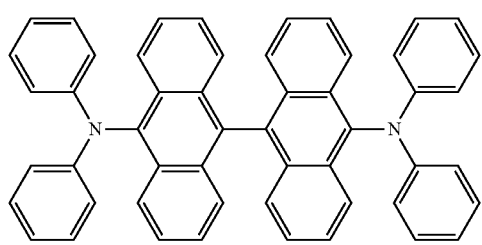
GD2

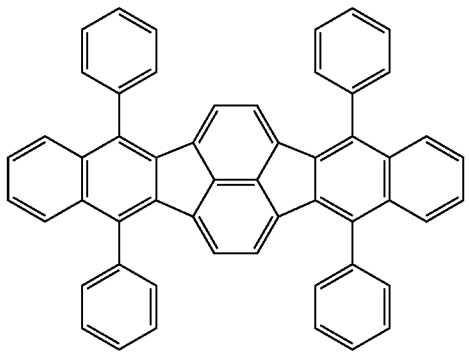
GD5

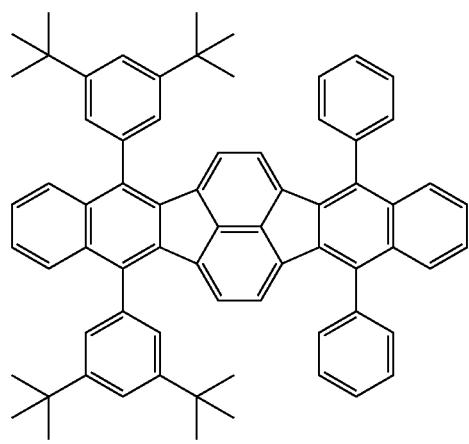
GD6
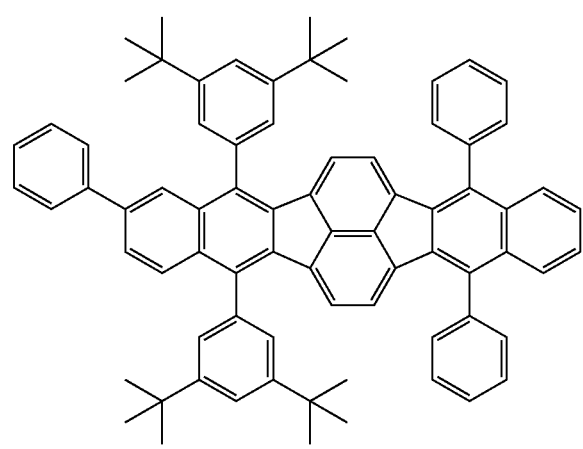
GD7
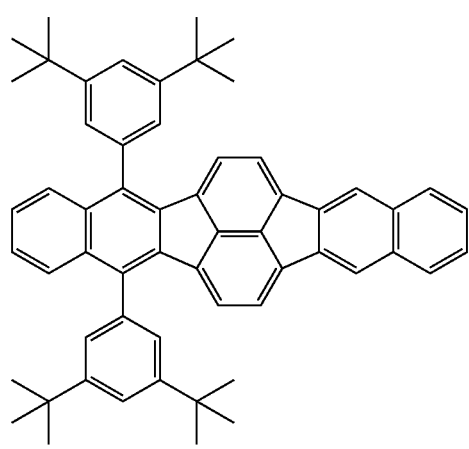
GD8
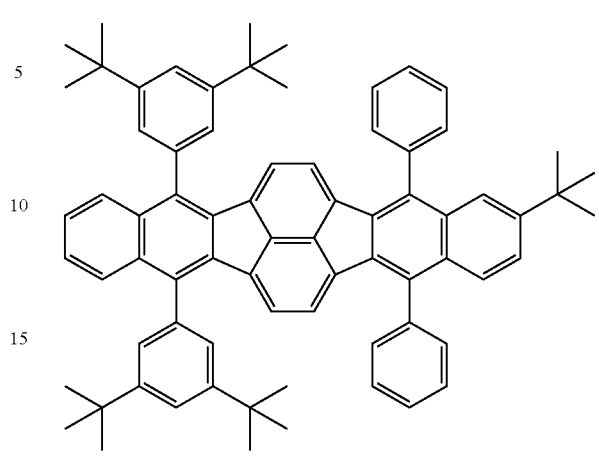
GD9
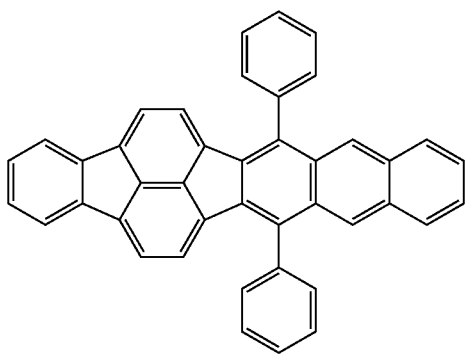
GD10
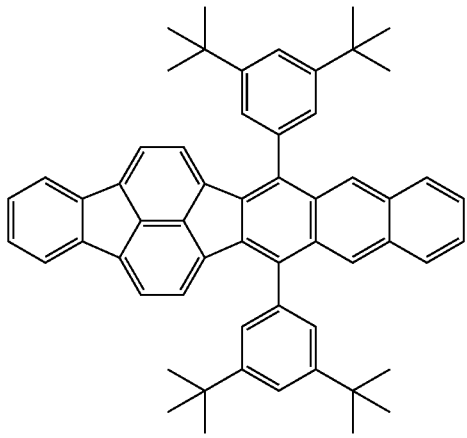
GD11
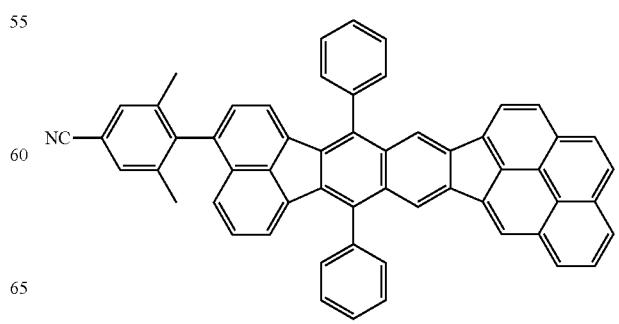
GD12

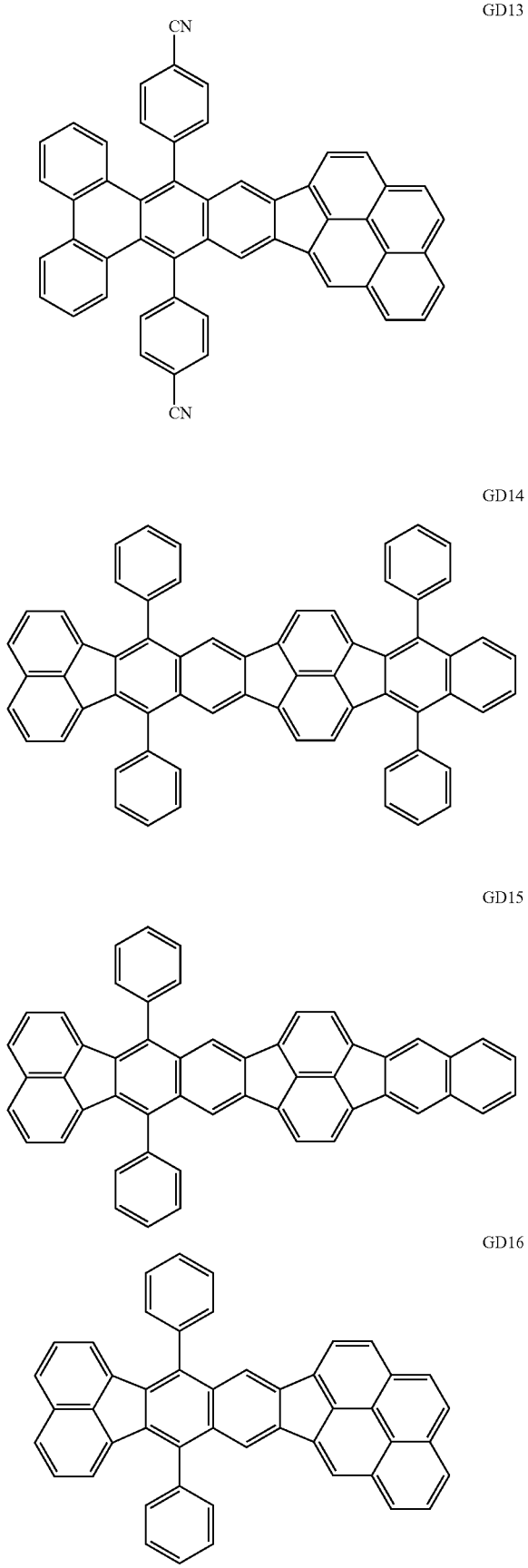
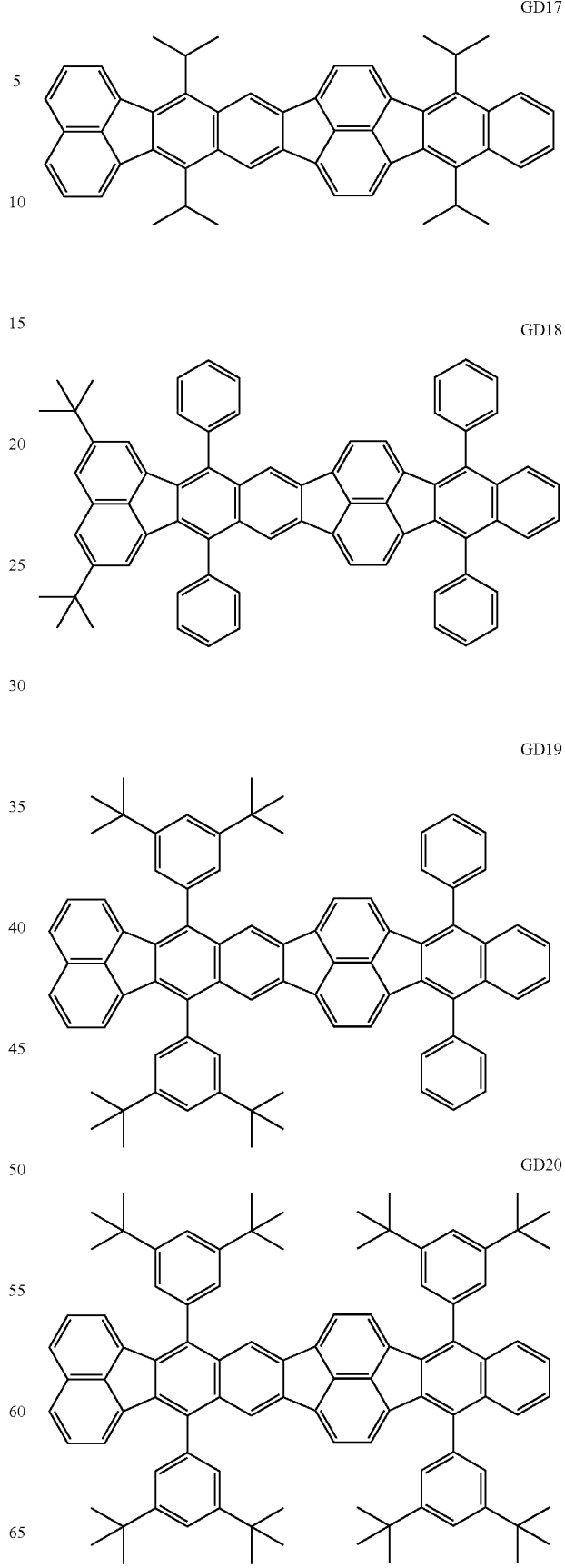

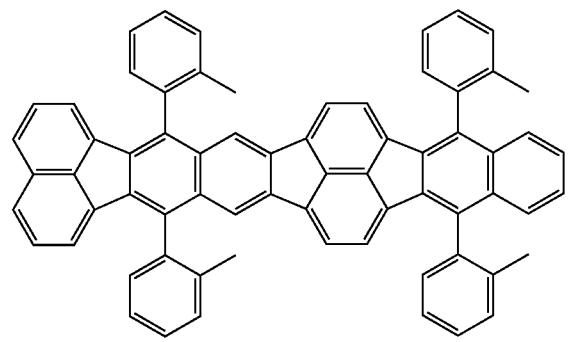
GD21

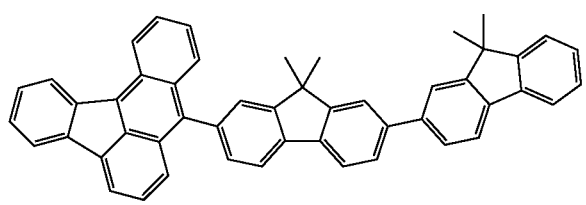
GD22

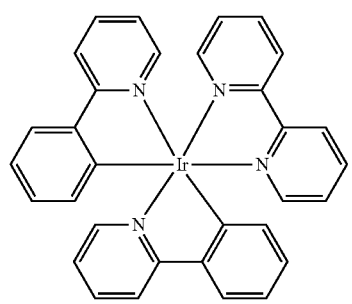
GD23

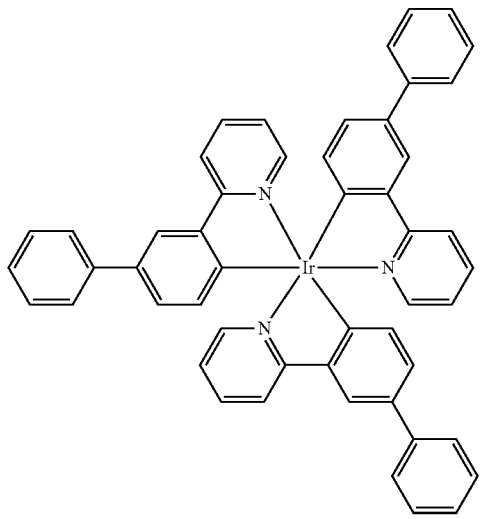
GD24

Among the green dopants listed as examples, compounds not having substituted amino groups having low bond energy can be employed.

The doping concentration using such a green dopant is preferably 0.1 to 10.0 wt %, more preferably 0.1 to 5.0 wt %. When the concentration is set to satisfy such a range, the electron trapping capability and the recombination probability become well-balanced. This enables suppression of concentration quenching and a decrease in the luminance, and provides good light emitting characteristics.

The following are examples of a red dopant used for an organic light emitting device according to an embodiment of the present disclosure. However, the present disclosure is not limited to these examples.

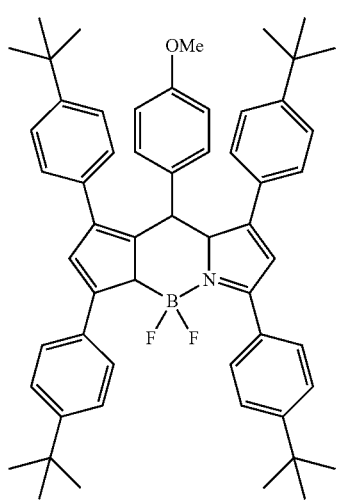
RD1

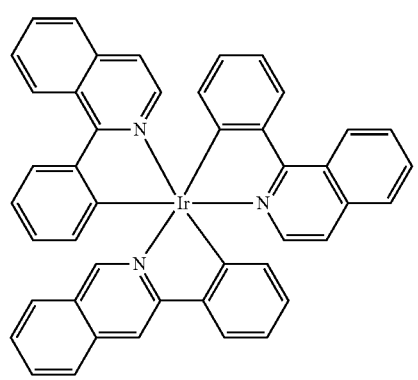
RD2

-continued
RD3
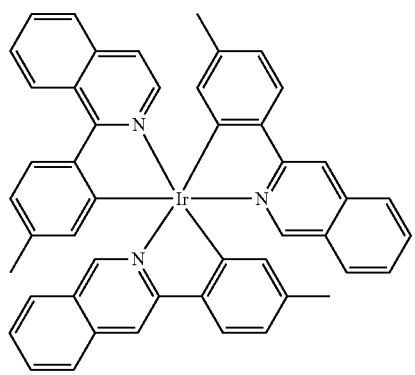
RD4
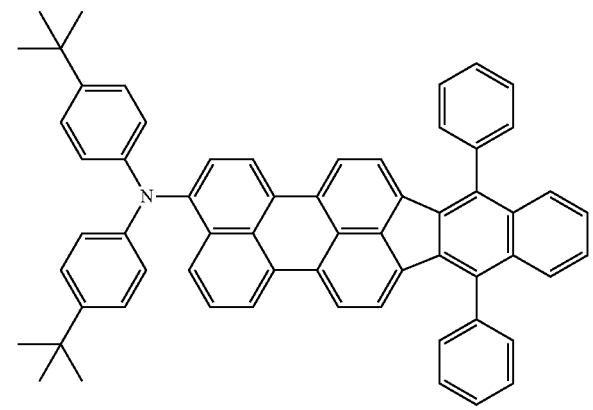
RD5
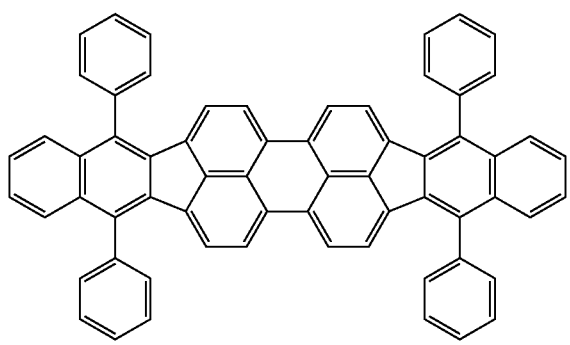
RD6
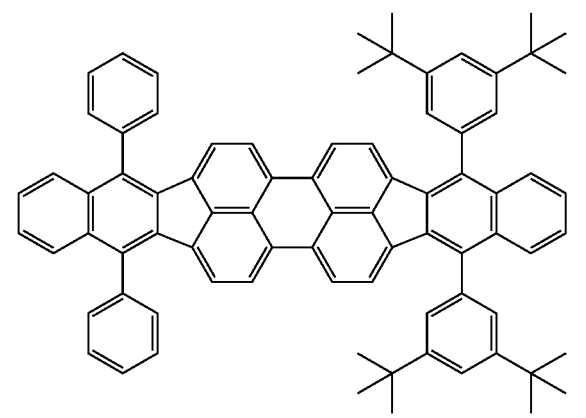
RD7
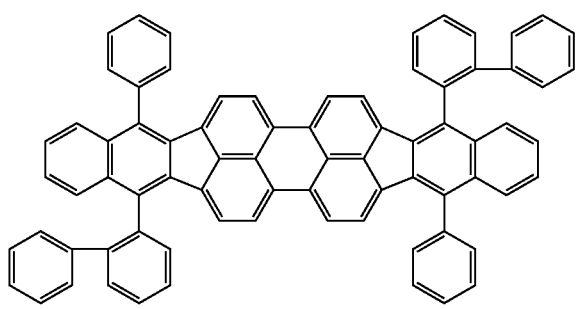
RD8
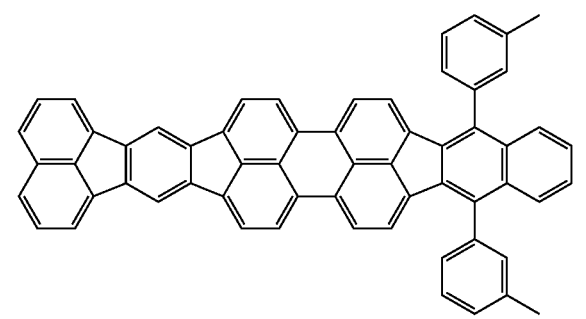
RD9
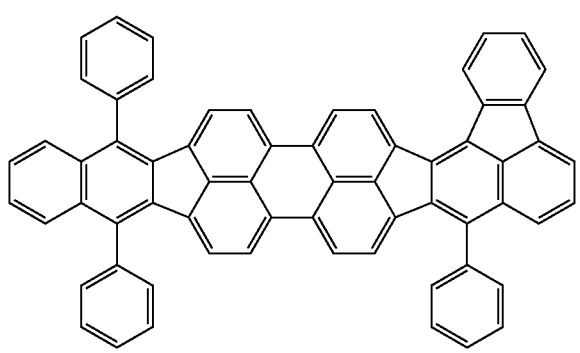
RD10
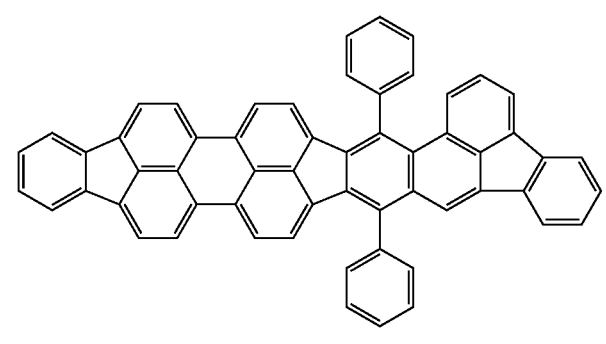

-continued
RD11
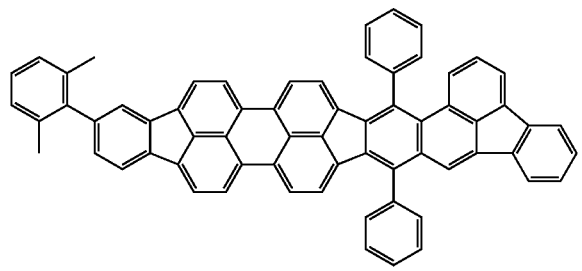
RD12
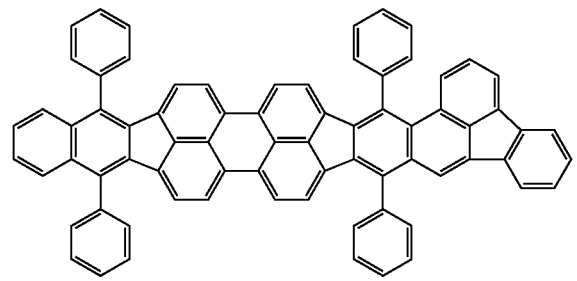
RD13
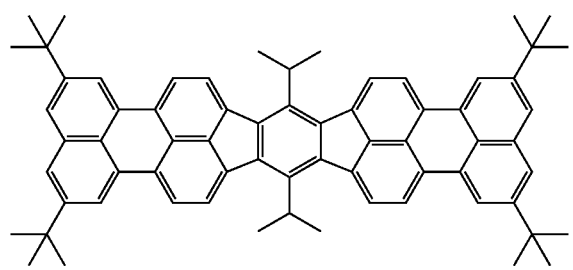
RD14
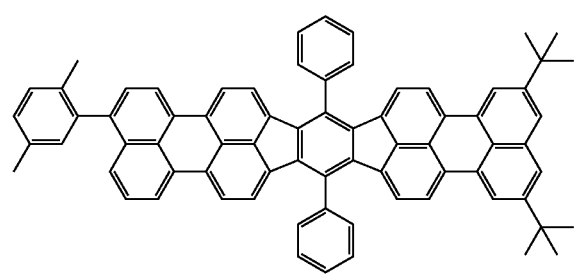
RD15
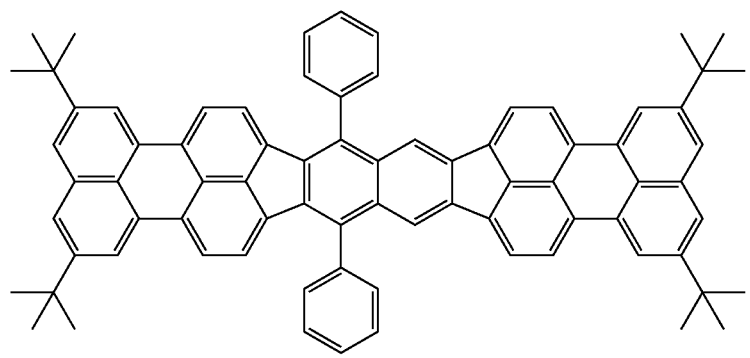
RD16
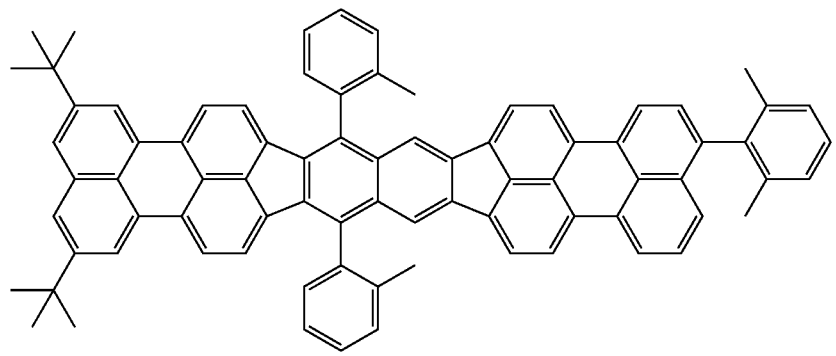

-continued
RD17
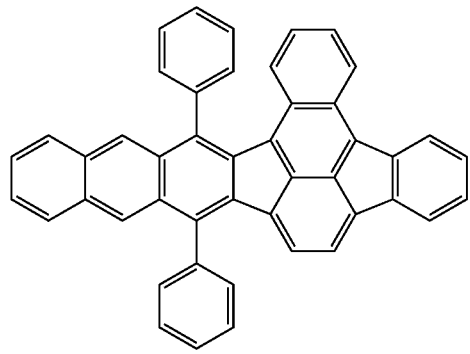
RD18
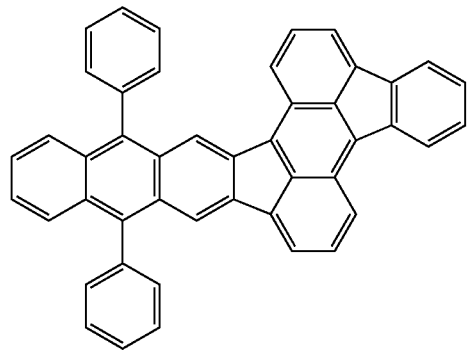
RD19
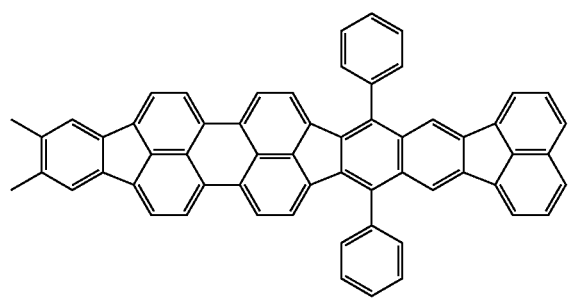
RD20
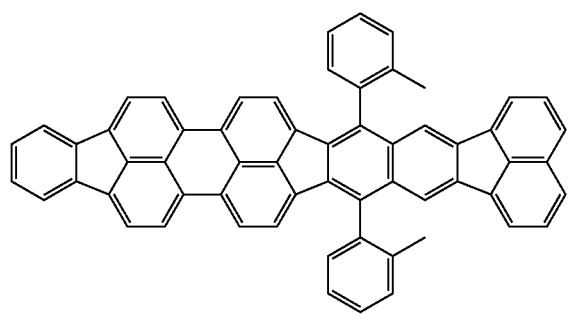
RD21
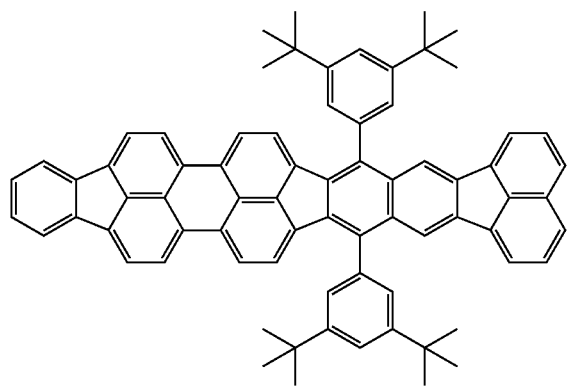
RD22
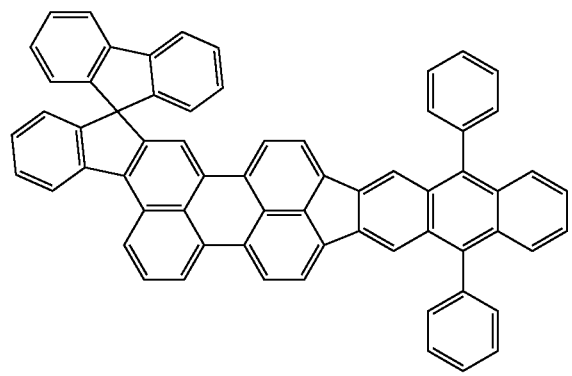
RD23
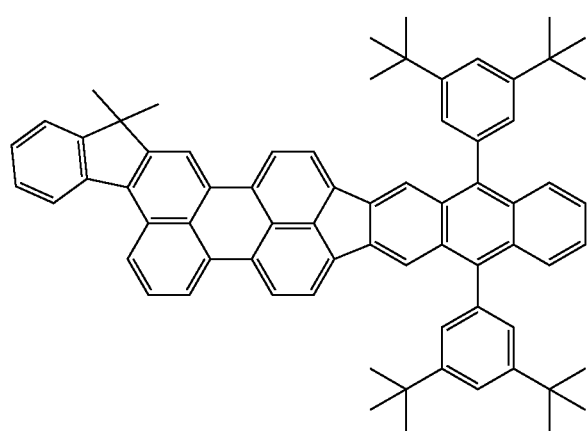

Among the red dopants listed as examples, preferred are compounds not having substituted amino groups having low bond energy.

More preferred are compounds composed of hydrocarbons alone.

The doping concentration using such a red dopant is preferably 0.1 to 5.0 wt %, more preferably 0.1 to 0.5 wt %. When the concentration is set to satisfy such a range, the electron trapping capability and the recombination probability become well-balanced. This enables suppression of concentration quenching and a decrease in the luminance, and provides good light emitting characteristics.

The light emitting layer of the organic light emitting device according to this embodiment may be composed of a plurality of components; these components can be classified into a host material as the main component and auxiliary components. The auxiliary components are compounds other than the main component. The auxiliary components may also be referred to as a guest material, a light emission assist material, and a charge injection material. The guest material is also referred to as a dopant material. The light emission assist material and the charge injection material may be organic compounds having the same structure or organic compounds having different structures. These materials are auxiliary components; however, in order to distinguish these materials from the guest material, these materials may also be referred to as host materials 2. The host material is a compound that is present within the light emitting layer and around the guest material as the matrix, and that mainly transports carriers and supplies excitation energy to the guest material.

The guest material is a compound that is present within the light emitting layer and mainly contributes to light emission. The concentration of the guest material relative to 100 wt % of the total amount of the compounds constituting the light emitting layer is 0.01 wt % or more and less than 50 wt %, preferably 0.1 wt % or more and 10 wt % or less. More preferably, in order to suppress concentration quenching, the concentration of the guest material is 0.1 wt % or more and 10 wt % or less. The guest material may be uniformly contained in the whole layer composed of the host material, or may be contained with concentration gradient, or may be contained in a specified partial region to form, in the host material layer, a region not containing the dopant material.

In the light emitting layer, materials contained in amounts of less than 50%, such as a light emission dopant, in order to further suppress concentration quenching and excimer light emission, preferably have glass transition temperatures of 135° C. or more, more preferably 150° C. or more.

The organic light emitting device according to this embodiment may include a plurality of light emitting layers. In this case, at least any one of the plurality of light emitting layers is a light emitting layer that emits light of a wavelength different from the wavelength of light emitted from another light emitting layer; light from these light emitting layers may be mixed, so that the organic light emitting device emits white light.

The organic light emitting device may include two or more light emitting layers in which each light emitting layer includes light emission materials that emit light of two or more emission colors.

When three or more light emitting layers are stacked, the positions of the light emitting layers are not limited. Specifically, the third light emitting layer may be in contact with the first light emitting layer or the second light emitting layer. Between a light emitting layer and another light emitting layer, another compound layer may be disposed. The other compound layer may be a charge generating layer, for example.

The hole injection layer of an organic light emitting device according to an embodiment of the present disclosure may be formed of an organic injection material such as HATCN or F4TCNQ or an inorganic hole injection material.

The electron injection layer of an organic light emitting device according to an embodiment of the present disclosure may be formed of a mixture of an electron-donating dopant and an electron transport material. Examples of the electron-donating dopant include alkali metals, alkaline-earth metals, rare-earth metals, and compounds of the foregoing. The electron injection layer is formed of an electron transport material containing 0.1 to 25 wt % of an alkali metal compound. The alkali metal compound is more preferably a cesium compound. Still more preferably, the cesium compound is cesium carbonate and a substance derived from cesium carbonate. In this embodiment, the electron injection layer can be formed by vapor co-deposition of cesium carbonate and the electron transport material. In order to ensure good electron injection capabilities, the electron injection layer can be formed so as to have a thickness of 10 nm to 100 nm. During vapor co-deposition, cesium carbonate may be, for example, decomposed to form, within the electron injection layer, cesium carbonate-derived suboxides such as $(Cs_{11}O_3)Cs_{10}$, $(Cs_{11}O_3)Cs$, or $Cs_{11}O_3$. Cesium and an organic compound may form a coordination compound.

Protective Layer

In the organic light emitting device according to this embodiment, the protective layer may be a silicon nitride (SiN) layer or a silicon oxynitride (SiON) layer formed by chemical vapor deposition (CVD), or an aluminum oxide layer formed by atomic layer deposition (ALD), or may be composed of a material or materials having very low permeability to external oxygen and moisture, such as silicon oxide and titanium oxide. The protective layer may be constituted by, as long as it has sufficiently high moisture barrier capabilities, a single layer or a plurality of layers. When the protective layer is constituted by a plurality of layers, layers individually composed of different materials may be stacked or layers composed of the same material but having different densities may be stacked. The protective layer can be designed in consideration of refractive index so that light is easily extracted from the organic light emitting device. The protective layer may also be referred to as a sealing layer.

Planarization Layer

In the organic light emitting device according to this embodiment, the planarization layer for planarizing irregularities of the protective layer can be disposed on the protective layer. The planarization layer enables a reduction in scattered light due to angled portions of irregularities of the protective layer, to suppress color mixture. The planarization layer is constituted by, for example, a resin layer formed by coating. The planarization layer may be formed so as to have a desired thickness, for example, 10 nm or more and 1000 nm or less.

Color Filter

In the organic light emitting device according to this embodiment, the color filter may be formed by applying a color resist onto the planarization layer, and patterning the color resist by lithography. Alternatively, the color filter may be disposed on an opposing substrate described later, and bonded onto the planarization layer. In this case, the planarization layer may have a thickness of 100 nm or more and 10000 nm or less.

The color resist is composed of, for example, a photo-curable resin; and regions irradiated with, for example, ultraviolet radiation cure to form a pattern.

In this embodiment, the color filter may have RGB color filters. The RGB color filters may be arranged in a stripe pattern, a square pattern, a delta pattern, or a Bayer pattern. In any of these patterns, each pixel may have a color filter having the shape of a rectangle, a square, or another polygon such as a hexagon or an octagon.

In the organic light emitting device according to this embodiment, a filler layer is disposed between the color filter and the opposing substrate. The filler layer is formed of, for example, an organic material such as an acrylic resin, an epoxy resin, or a silicone resin. A planarization layer may be formed between the color filter and the filler layer. This planarization layer may be the same as or different from the planarization layer disposed between the color filter and the sealing layer. When these two planarization layers are formed of the same material, the planarization layers are firmly bonded together outside of the display area.

The "outside of the display area" means a region of the edge of the substrate where the organic light emitting device is not disposed, that is, a region not contributing to display-ing.

When the organic light emitting device includes the color filter, such elements may be stacked in the following order: the organic light emitting device, an inorganic layer, a first resin layer, the color filter, and a second resin layer. The first resin layer may be a planarization layer. The second resin layer may be a filler layer. The first resin layer may have a smaller thickness than the second resin layer. When the first resin layer has a small thickness, the distance from the organic light emitting device to the color filter is short to thereby suppress color mixture. Specifically, the thickness is preferably 50 nm or less, more preferably 10 nm or less.

On an organic light emitting device according to an embodiment of the present disclosure, a color filter may be formed. Alternatively, a color filter may be formed on the opposing substrate described later and bonded to the organic light emitting device. The color filter directly formed on the organic light emitting device is referred to as an on-chip color filter. On the other hand, the color filter formed on the opposing substrate and bonded to the organic light emitting device is referred to as an on-glass color filter. The step of forming the on-chip color filter will be described in EXAMPLES.

Opposing Substrate

In the organic light emitting device according to this embodiment, the opposing substrate can be a transparent substrate. The opposing substrate can be constituted by, for example, a transparent glass substrate or a transparent plastic substrate.

The organic light emitting device may contain a binder resin. Non-limiting examples of the binder resin include polyvinylcarbazole resins, polycarbonate resins, polyester resins, ABS resins, acrylic resins, polyimide resins, phenol resins, epoxy resins, silicone resins, and urea resins. Such binder resins may be used as a homopolymer or a copolymer alone or in combination of two or more thereof. The binder resin may be optionally combined with a publicly known additive such as a plasticizer, an antioxidant, or an ultraviolet absorbent.

Applications of Organic Light Emitting Device According to One Embodiment of the Present Disclosure The organic light emitting device according to this embodiment can be used as a constituent member for a display apparatus or an illumination apparatus, and is also applicable to the exposure light source of an electrophotographic image-forming apparatus, the backlight of a liquid crystal display apparatus, or a light emitting apparatus in which a white light source is equipped with a color filter.

The display apparatus may be an image information processing apparatus including an image input section configured to input image information from, for example, an area CCD, a linear CCD, or a memory card, and an information processing section configured to process the inputted information, and configured to display the inputted image on a display unit.

An image pickup apparatus or an ink jet printer may have a display unit having a touch panel function. The operation type of this touch panel function is not particularly limited, and may be an infrared type, a capacitance type, a resistive film type, or an electromagnetic induction type. The display apparatus may be used as a display unit of a multifunctional printer.

Figure 2:
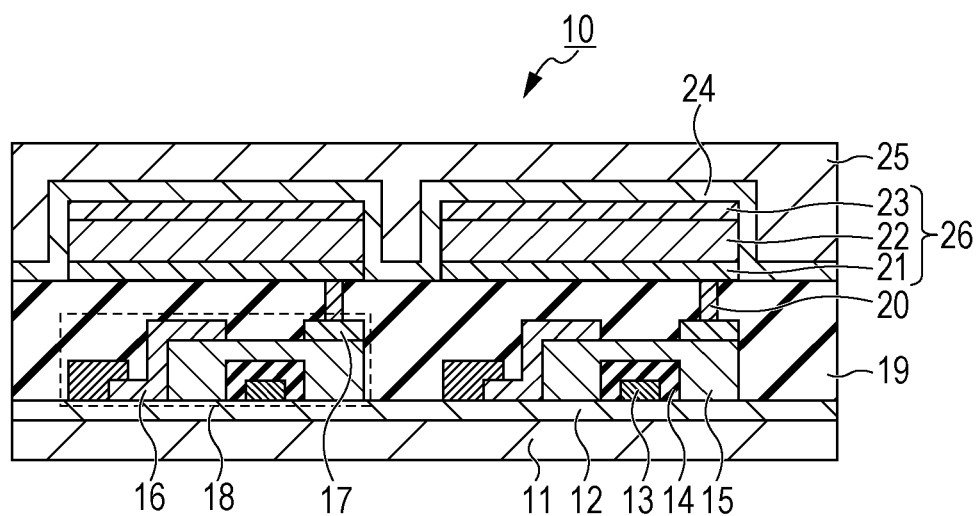
FIG. 2 is a schematic sectional view illustrating an example of a display apparatus including an organic light emitting device according to an embodiment of the present disclosure.

Hereinafter, a display apparatus according to an embodiment will be described with reference to a drawing. FIG. 2 is a schematic sectional view illustrating an example of a display apparatus including an organic light emitting device and a TFT device connected to the organic light emitting device. The TFT device is an example of an active device.

Referring to FIG. 2, a display apparatus 10 includes a substrate 11 composed of, for example, glass and a moistureproof film 12 disposed on the substrate 11 to protect TFT devices or an organic compound layer. The display apparatus 10 further includes a gate electrode 13 composed of metal, a gate insulating film 14, and a semiconductor layer 15.

A TFT device 18 includes a semiconductor layer 15, a drain electrode 16, and a source electrode 17. Over the TFT device 18, an insulating film 19 is disposed. An anode 21 constituting an organic light emitting device 26 is connected, via a contact hole 20, to a source electrode 17.

Incidentally, the configuration of electric connections of electrodes (anode and cathode) included in the organic light emitting device and electrodes (source electrode and drain electrode) included in a TFT is not limited to the configuration illustrated in FIG. 2. In other words, any configuration may be employed as long as one of the anode and the cathode is electrically connected to one of the source electrode and the drain electrode of the TFT device.

FIG. 2 illustrates, in the display apparatus 10, an organic compound layer 22 like a single layer; however, the organic compound layer 22 may include a plurality of layers. On a cathode 23, a first protective layer 24 and a second protective layer 25 are disposed for reducing deterioration of the organic light emitting device.

In FIG. 2, the display apparatus 10 employs, as the switching devices, transistors; alternatively, MIM devices may be employed as the switching devices.

In FIG. 2, in the display apparatus 10, the transistors are not limited to transistors using a single-crystal silicon wafer, and may be thin-film transistors having an active layer on the insulating surface of the substrate. The active layer may be formed of single-crystal silicon, a non-single-crystal silicon such as amorphous silicon or microcrystal silicon, or a non-single-crystal oxide semiconductor such as indium zinc oxide or indium gallium zinc oxide. Incidentally, thin-film transistors are also referred to as TFT devices.

In FIG. 2, the transistors included in the display apparatus 10 may be formed within the substrate such as a Si substrate. The phrase "formed within the substrate" means that the substrate itself such as a Si substrate is processed to form transistors. In other words, the configuration in which transistors are included within the substrate can be regarded as a configuration in which the substrate and the transistors are formed as a single unit.

The organic light emitting device according to this embodiment is controlled, in terms of emission luminance, by TFTs as examples of switching devices. A plurality of such organic light emitting devices are arranged in a plane, to emit light at individual emission luminances to thereby display images. Incidentally, the switching devices according to this embodiment are not limited to TFTs, and may be transistors formed of low temperature polysilicon or active matrix drivers formed on the substrate such as a Si substrate. The phrase "on the substrate" also encompasses "within the substrate". Whether transistors are formed within the substrate or TFTs are formed depends on the size of the display unit. For example, when the display unit has a size of about 0.5 inches, the organic light emitting device can be formed on a Si substrate.

Figure 3:
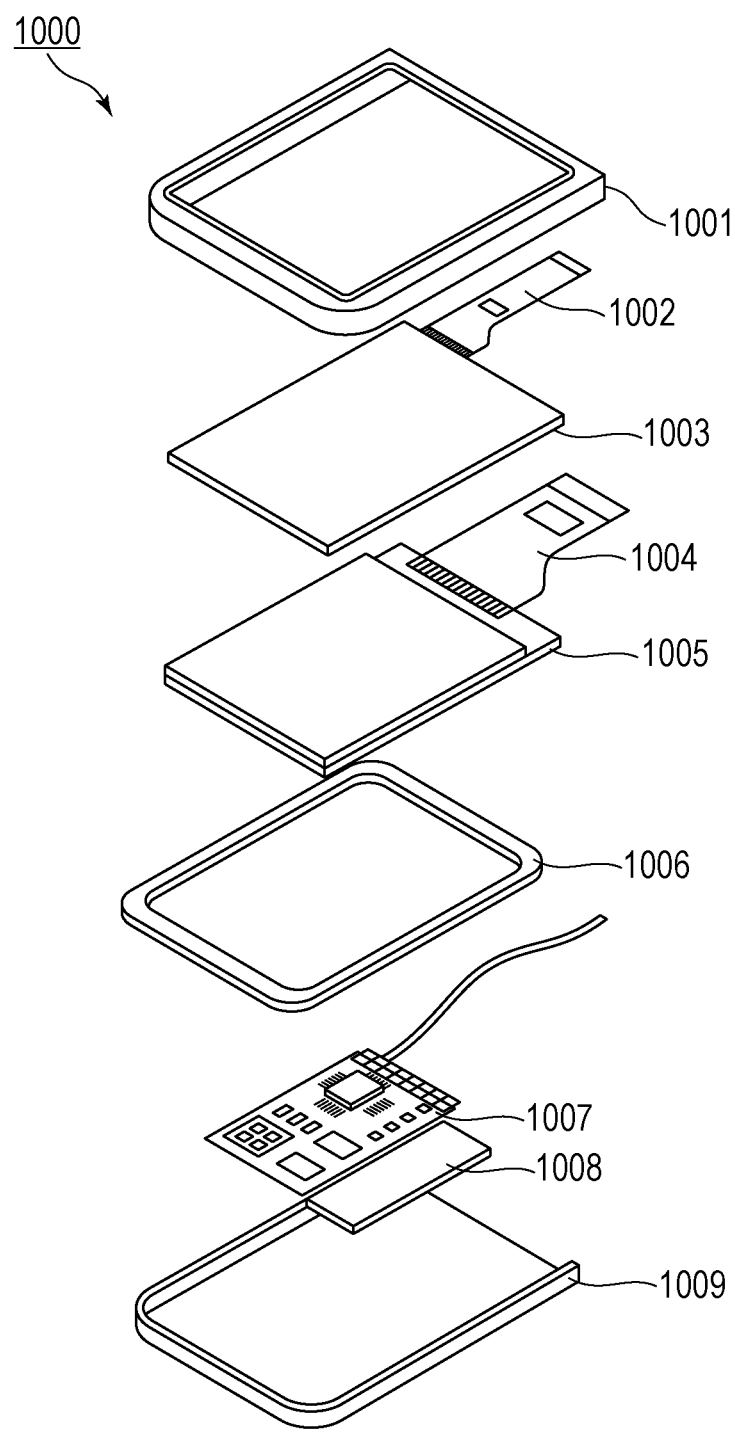
FIG. 3 is a schematic view illustrating an example of a display apparatus according to an embodiment of the present disclosure.

FIG. 3 is a schematic view illustrating an example of a display apparatus according to an embodiment. A display apparatus 1000 may include, between an upper cover 1001 and a lower cover 1009, a touch panel 1003, a display panel 1005, a frame 1006, a circuit substrate 1007, and a battery 1008. To the touch panel 1003 and the display panel 1005, flexible printed circuit FPCs 1002 and 1004 are respectively connected. On the circuit substrate 1007, transistors are formed by printing. The battery 1008 may not be installed when the display apparatus is not a mobile apparatus. When the display apparatus is a mobile apparatus, the battery 1008 may be installed in another position.

A display apparatus according to this embodiment may be used as a display unit of an image pickup apparatus including an optical unit including a plurality of lenses and an image pickup device configured to receive light having passed the optical unit. The image pickup apparatus may include a display unit configured to display information obtained by the image pickup device. The display unit may be a display unit exposed outside of the image pickup apparatus, or a display unit disposed within the finder. The image pickup apparatus may be a digital camera or a digital video camera. The image pickup apparatus is also referred to as a photoelectric conversion apparatus.

Figure 4A:
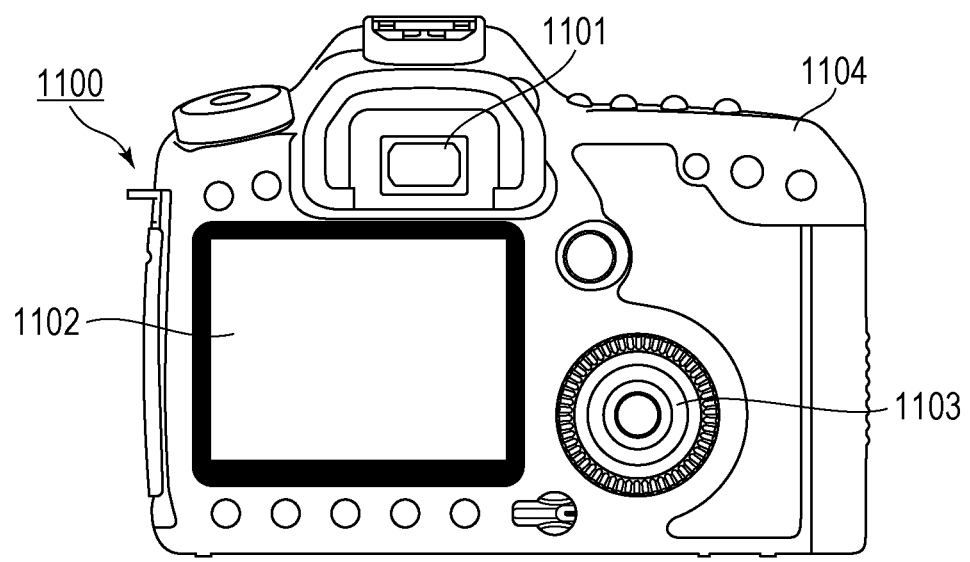
FIG. 4A is a schematic view illustrating an example of an image pickup apparatus according to an embodiment of the present disclosure.

FIG. 4A is a schematic view illustrating an example of an image pickup apparatus according to an embodiment. An image pickup apparatus 1100 may include a view finder 1101, a rear surface display 1102, an operation unit 1103, and a housing 1104. The view finder 1101 may include the display apparatus according to this embodiment. In this case, the display apparatus may display not only an image to be captured, but also, for example, environmental information and image capture instructions. Examples of the environmental information include the intensity of external light, the orientation of external light, the moving speed of the subject, and the probability that the subject may hide behind an obstacle.

Since the timing suitable for capturing an image lasts for a very short period, the information is desirably displayed with minimum delay. Thus, a display apparatus employing an organic light emitting device according to an embodiment of the present disclosure can be used because the organic light emitting device responds at a high speed. The display apparatus employing the organic light emitting device can be more suitably used for such image pickup apparatuses required to display images at high speed than liquid crystal display apparatuses.

The image pickup apparatus 1100 includes an optical unit (not shown). The optical unit includes a plurality of lenses and is configured to form an image in the image pickup device contained within the housing 1104. The plurality of lenses can be adjusted in terms of relative positions, to thereby adjust the focus. This operation can also be performed automatically.

The display apparatus according to this embodiment may include red, green, and blue color filters. These red, green, and blue color filters may be arranged in a delta pattern.

The display apparatus according to this embodiment may be used for a display unit of a portable terminal. In this case, the display apparatus may have both of a display function and an operation function. Examples of the portable terminal include cellular phones such as smartphones, tablets, and head mount displays.

Figure 4B:
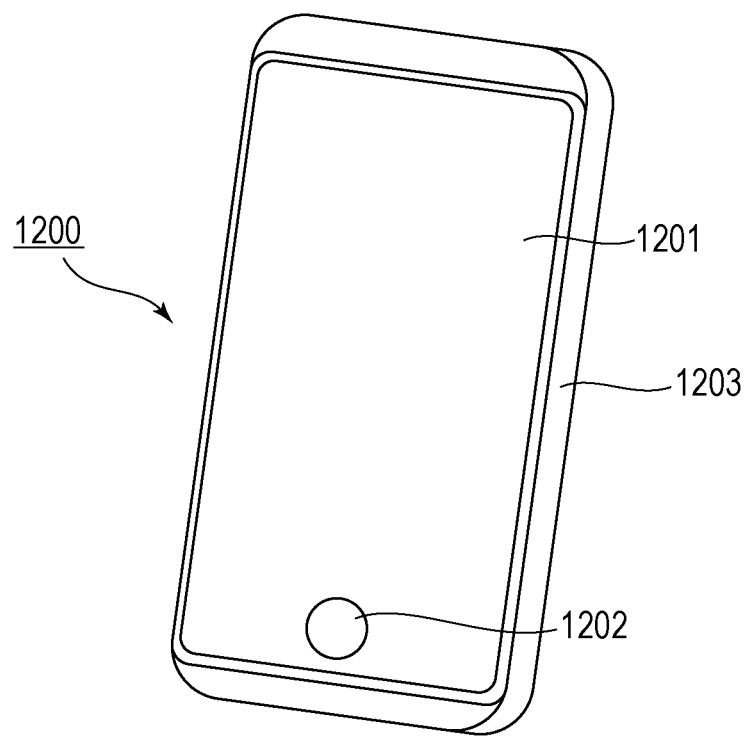
FIG. 4B is a schematic view illustrating an example of an electronic apparatus according to an embodiment of the present disclosure.

FIG. 4B is a schematic view illustrating an example of an electronic apparatus according to an embodiment. An electronic apparatus 1200 includes a display unit 1201, an operation unit 1202, and a housing 1203. The housing 1203 may include circuits, a printed substrate including the circuits, a battery, and a communication unit. The operation unit 1202 may be a button or a touch-panel-type sensor unit. The operation unit may be a biometric unit configured to scan a fingerprint for unlocking, for example. Such an electronic apparatus including a communication unit can also be referred to as a communication apparatus.

Figure 5A:
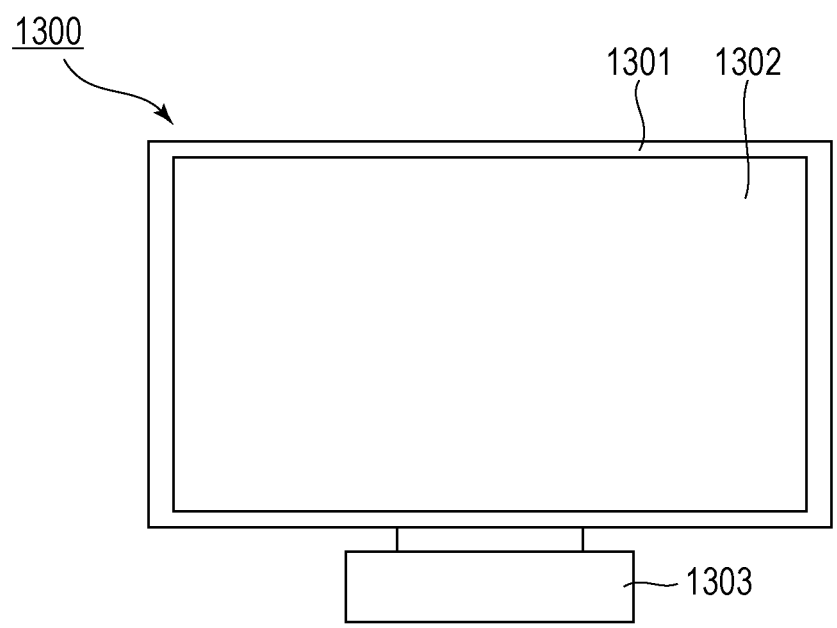
FIG. 5A is a schematic view illustrating an example of a display apparatus according to an embodiment of the present disclosure.
Figure 5B:
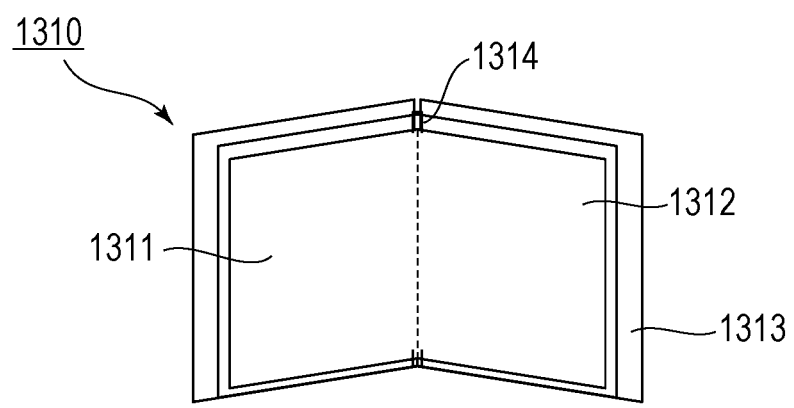
FIG. 5B is a schematic view illustrating an example of a foldable display apparatus.

FIGS. 5A and 5B are schematic views illustrating examples of a display apparatus according to an embodiment. FIG. 5A illustrates a display apparatus such as a television monitor or a PC monitor. A display apparatus 1300 includes a frame 1301 and a display unit 1302. The display unit 1302 may employ the light emitting device according to the embodiment.

The display apparatus includes a base 1303, which supports the frame 1301 and the display unit 1302. The base 1303 is not limited to the form illustrated in FIG. 5A. The lower side of the frame 1301 may also function as the base.

The frame 1301 and the display unit 1302 may be curved. The radius of the curvature may be 5000 mm or more and 6000 mm or less.

FIG. 5B is a schematic view illustrating another example of the display apparatus according to this embodiment. A display apparatus 1310 in FIG. 5B can be folded, namely a foldable display apparatus. The display apparatus 1310 includes a first display unit 1311, a second display unit 1312, a housing 1313, and a folding point 1314. The first display unit 1311 and the second display unit 1312 may include the light emitting device according to the embodiment. The first display unit 1311 and the second display unit 1312 may be collectively designed as a seamless single display apparatus. The first display unit 1311 and the second display unit 1312 can be sectioned with respect to the folding point. Specifically, the first display unit 1311 and the second display unit 1312 may individually display different images; and the first and second display units may collectively display a single image.

Figure 6A:
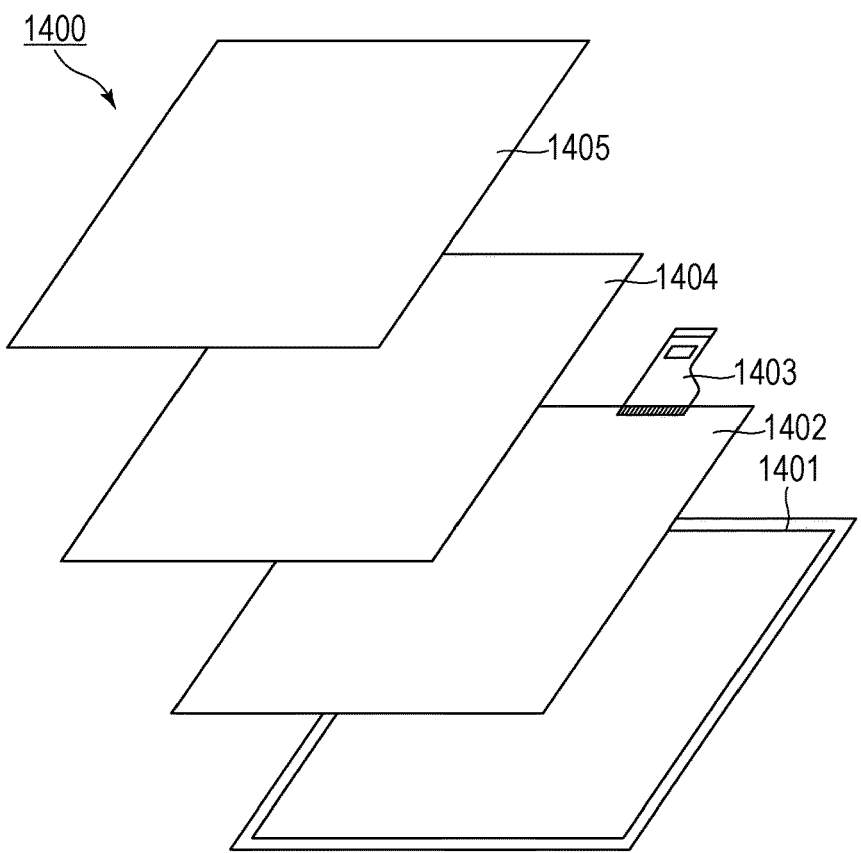
FIG. 6A is a schematic view illustrating an example of an illumination apparatus according to an embodiment of the present disclosure.

FIG. 6A is a schematic view illustrating an example of an illumination apparatus according to an embodiment. An illumination apparatus 1400 may include a housing 1401, a light source 1402, a circuit substrate 1403, an optical film 1404, and a light diffusion unit 1405. The light source may include the organic light emitting device according to the embodiment. An optical filter may be provided to improve color rendering of the light source. The light diffusion unit is configured to effectively diffuse light from the light source to deliver the light to a wide area, such as lighting up. The optical filter and the light diffusion unit may be provided on the light exit side of the illumination. The illumination may be optionally equipped with a cover for the outermost portion thereof.

The illumination apparatus is, for example, an apparatus configured to illuminate the inside of a room. The illumination apparatus may be configured to emit light of any color of white, neutral white, and colors from blue to red. The illumination apparatus may include a light modulation circuit for modulating the light. The illumination apparatus may include an organic light emitting device according to an embodiment of the present disclosure and a power supply circuit connected to the organic light emitting device. The power supply circuit is configured to convert alternating current voltage to direct current voltage. The "white" corresponds to a color temperature of 4200 K. The "neutral white" corresponds to a color temperature of 5000 K. The illumination apparatus may include a color filter.

The illumination apparatus according to this embodiment may include a heat dissipation unit. The heat dissipation unit is configured to release heat inside of the apparatus to the outside of the apparatus. The heat dissipation unit is formed of, for example, a metal having a high specific heat or liquid silicone.

Figure 6B:
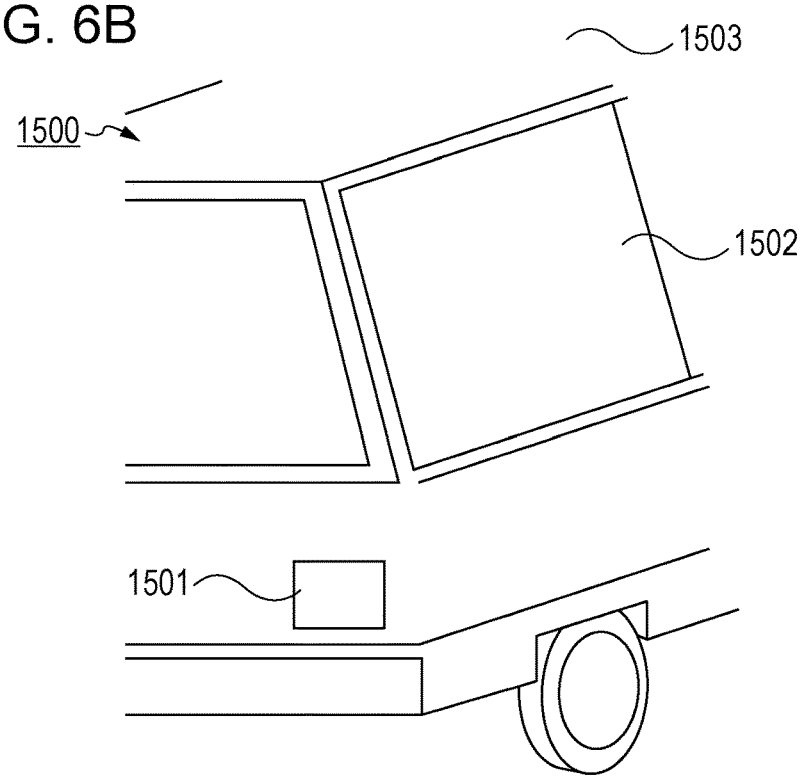
FIG. 6B is a schematic view illustrating an example of an automobile including a vehicle illumination unit according to an embodiment of the present disclosure.

FIG. 6B is a schematic view of an automobile serving as an example of a moving object according to an embodiment. The automobile includes a tail lamp serving as an example of the illumination unit. An automobile 1500 includes a tail lamp 1501 that may be configured to turn on upon braking, for example.

The tail lamp 1501 may include the organic light emitting device according to the embodiment. The tail lamp may include a protective member for protecting the organic EL device. The material forming the protective member is not limited as long as it has relatively high strength and is transparent. The protective member can be formed of polycarbonate, for example. The polycarbonate may be mixed with, for example, a furandicarboxylic acid derivative or an acrylonitrile derivative.

The automobile 1500 may include an automobile body 1503 and a window 1502 attached to the automobile body 1503. When the window is not windows for checking ahead or behind of the automobile, it may be designed as a transparent display. This transparent display may include the organic light emitting device according to the embodiment. In this case, constituent members of the organic light emitting device, such as electrodes, are provided as transparent members.

The moving object according to this embodiment may be a ship, an aircraft, or a drone, for example. The moving object may include a body and an illumination unit provided to the body. The illumination unit may emit light in order to indicate the position of the body. The illumination unit includes the organic light emitting device according to the embodiment.

As has been described so far, apparatuses employing the organic light emitting device according to the embodiment enable displaying of images with high quality for a long time with stability.

EXAMPLES

Example 1

In this Example, an organic light emitting device was produced in the following manner. On a substrate, lower electrodes were formed by patterning. Between the lower electrodes, an insulating layer was formed. The insulating layer was formed of a silicon oxide film. The insulating layer was formed with a thickness of 65 nm. The insulating layer was formed so as to have angled portions having a pixel-opening-side taper angle of 80° and an inter-pixel-side taper angle of 75°. The pixels were arranged in a delta pattern. The inter-pixel-opening distance between adjacent pixels was set to 1.4 μm. The inter-lower-electrode distance was set to 0.6 μm.

On the substrate, organic compound layers described in the following Table 1 were formed. Specifically, the organic compound layers were a hole injection layer, a hole transport layer, an electron blocking layer, a first light emitting layer, an intermediate layer, a second light emitting layer, a hole blocking layer, an electron transport layer, and an electron injection layer. On these layers, a cathode was formed to produce a top-emission-type organic light emitting device. The hole injection layer was formed of HATCN having the following structure.

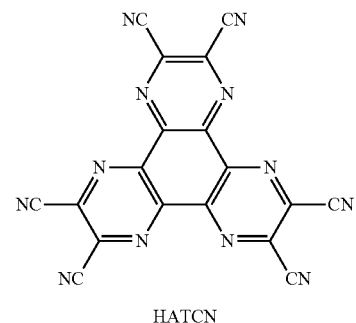

HATCN

TABLE 1

|  |  | Materials |  | Thickness (nm) |
| --- | --- | --- | --- | --- |
| Cathode |  | Mg:Ag = 1:1 |  | 10 |
| Electron injection layer |  | LiF |  | 1 |
| Electron transport layer |  | ET1 |  | 30 |
| Hole blocking layer |  | ET8 |  | 70 |
| Light emitting layer 2 | Host B | EMH1 | Weight ratio | 10 |
|  | Dopant C | BD6 | EMH1:BD6 = 99.4:0.6 |  |
| Light emitting layer 1 | Host A | EMH1 | Weight ratio | 10 |
|  | Dopant A | GD7 | EMH1:GD7:RD6 = 96.5:3.1:0.4 |  |
|  | Dopant B | RD6 |  |  |
| Electron blocking layer |  | HT14 |  | 10 |
| Hole transport layer |  | HT2 |  | 15 |
| Hole injection layer |  | HATCN |  | 7 |

Subsequently, as a protective layer, a SiN film was formed by CVD with a thickness of 1.5 µm. Subsequently, a planarization layer formed of a photocurable acrylic resin was disposed. In addition, color filters were formed by the following steps. Specifically, red, green, and blue color filters were arranged in a delta pattern.

Figure 7A:
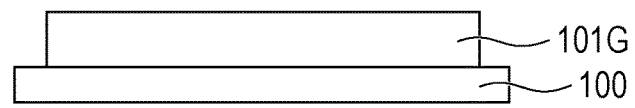
FIGS. 7A to 7I illustrate an example of a step of forming on-chip color filters of an organic light emitting device according to an embodiment of the present disclosure.
Figure 7B:
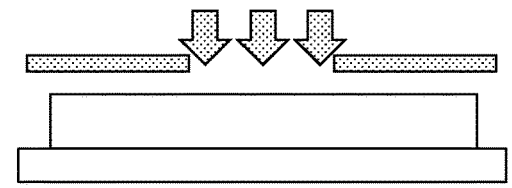
Figure 7C:
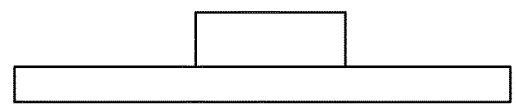
Figure 7D:
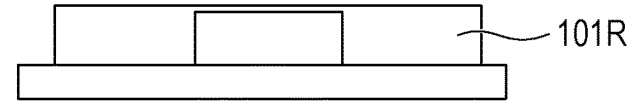
Figure 7E:
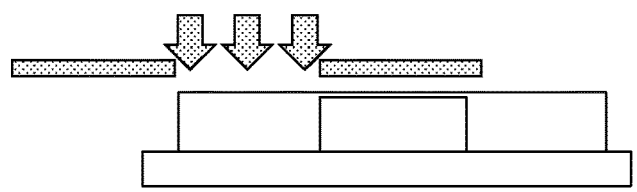
Figure 7F:
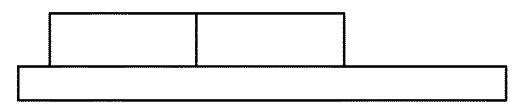
Figure 7G:
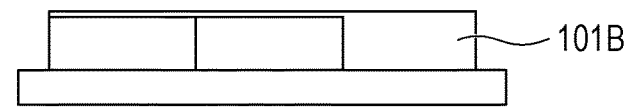
Figure 7H:
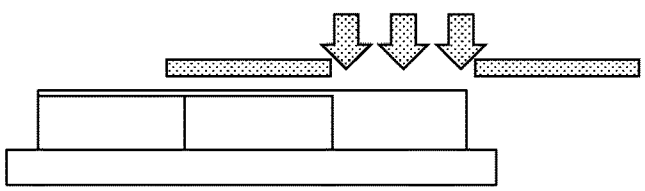
Figure 7I:
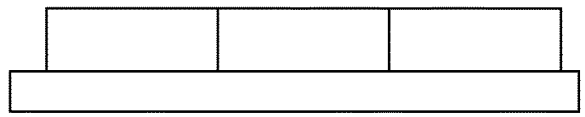

FIGS. 7A to 7I are schematic views illustrating the step of forming color filter layers. FIGS. 7A to 7I do not illustrate portions of the organic light emitting device below a planarization layer 100. Referring to FIG. 7A, over the whole surface of the planarization layer 100, a green color filter layer 101G was formed by spin-coating. Annealing was performed at a temperature to cure the green color filter layer. Subsequently, referring to FIG. 7B, exposure and development were performed by photolithography. Furthermore, annealing was performed at a temperature to dry the patterned color filter layer. Subsequently, the unexposed region of the green color filter layer was removed. This provided, referring to FIG. 7C, the pattern of the green color filter layer.

Similarly, a red color filter layer was formed. A red color filter layer 101R was formed over the whole surface (FIG. 7D), exposed and developed by photolithography (FIG. 7E); and the unexposed region was removed. As a result, referring to FIG. 7F, the pattern of the red color filter layer was formed adjacent to the green color filter layer.

Similarly, a blue color filter layer was formed. A blue color filter layer 101B was formed over the whole surface (FIG. 7G), exposed and developed by photolithography (FIG. 7H); and the unexposed region was removed. As a result, referring to FIG. 7I, the pattern of the blue color filter layer was formed adjacent to the green color filter layer.

To each pixel of the obtained organic light emitting device, a current was applied at a current density of 10 mA/cm$^2$, and a spectral radiance meter was used to detect emission of light in a direction perpendicular to the substrate.

Examples 2 to 10 and Comparative Examples 1 to 5

Devices were produced as in Example 1 except that the compounds of organic layers in Example 1 were changed to compounds described in the following Table 2. The materials REF1 to REF7 are compounds described below.

TABLE 2

|  | Hole transport layer | Electron blocking layer | Light emitting layer 1 Host A | Light emitting layer 2 Host B | Hole blocking layer | Electron transport layer | Layer having the lowest Tg |
|---|---|---|---|---|---|---|---|
| Example 1 | HT2 | HT14 | EMH1 | EMH1 | ET8 | ET1 | ET1 |
| Tg (° C.) | 140 | 135 | 165 | 165 | 160 | 130 | 130 |
| Example 2 | HT4 | HT14 | EMH3 | EMH3 | ET8 | ET1 | EMH3 ET1 |
| Tg (° C.) | 140 | 135 | 130 | 130 | 160 | 130 | 130 |
| Example 3 | HT5 | HT14 | EMH1 | EMH13 | ET8 | ET2 | HT5 |
| Tg (° C.) | 133 | 135 | 165 | 148 | 160 | 168 | 133 |
| Example 4 | HT4 | HT14 | EMH8 | EMH1 | ET8 | ET2 | HT14 |
| Tg (° C.) | 140 | 135 | 153 | 165 | 160 | 168 | 135 |
| Example 5 | HT1 | HT14 | EMH8 | EMH8 | ET8 | ET2 | HT14 |
| Tg (° C.) | 184 | 135 | 153 | 153 | 160 | 168 | 135 |
| Example 6 | HT4 | HT15 | EMH6 | EMH6 | ET8 | ET2 | HT4 |
| Tg (° C.) | 140 | 153 | 144 | 144 | 160 | 168 | 140 |
| Example 7 | HT1 | HT4 | EMH8 | EMH1 | ET8 | ET2 | HT4 |
| Tg (° C.) | 184 | 140 | 153 | 165 | 160 | 168 | 140 |
| Example 8 | HT1 | HT4 | EMH8 | EMH8 | ET8 | ET2 | HT4 |
| Tg (° C.) | 184 | 140 | 153 | 153 | 160 | 168 | 140 |
| Example 9 | HT1 | HT15 | EMH1 | EMH1 | ET8 | ET2 | HT15 |
| Tg (° C.) | 184 | 153 | 165 | 165 | 160 | 168 | 153 |
| Example 10 | HT1 | HT15 | EMH22 | EMH22 | ET8 | ET2 | HT15 |
| Tg (° C.) | 184 | 153 | 166 | 166 | 160 | 168 | 153 |
| Comparative Example 1 | HT4 | HT14 | EMH1 | EMH1 | ET8 | REF1 | REF1 |
| Tg (° C.) | 140 | 140 | 165 | 165 | 160 | 63 | 63 |
| Comparative Example 2 | REF2 | HT15 | EMH4 | EMH4 | ET12 | ET1 | REF2 |
| Tg (° C.) | 95 | 153 | 144 | 144 | 136 | 130 | 95 |
| Comparative Example 3 | REF4 | HT14 | EMH3 | EMH4 | ET12 | ET1 | REF4 |
| Tg (° C.) | 120 | 140 | 148 | 144 | 136 | 130 | 120 |
| Comparative Example 4 | HT1 | HT14 | EMH8 | EMH8 | ET8 | ET2 | HT14 |
| Tg (° C.) | 184 | 140 | 153 | 153 | 160 | 168 | 135 |
| Comparative Example 5 | HT1 | HT14 | EMH8 | EMH8 | ET8 | ET2 | HT4 |
| Tg (° C.) | 184 | 140 | 153 | 153 | 160 | 168 | 140 |

A differential scanning calorimetry (DSC) instrument (manufactured by NETZSCH-Gerätebau GmbH, DSC 204 F1) was used to measure the glass transition temperature of each compound. In the measurement, the powder of each compound was measured. The glass transition temperature was measured in the following manner: a sample was heated at 10° C./min from a low temperature to a high temperature, rapidly cooled at 40° C./min to an amorphous state; subsequently, while the sample was heated again at 10° C./min from a low temperature to a high temperature, the glass transition temperature was measured. Such measured glass transition temperatures are described in Table 2.

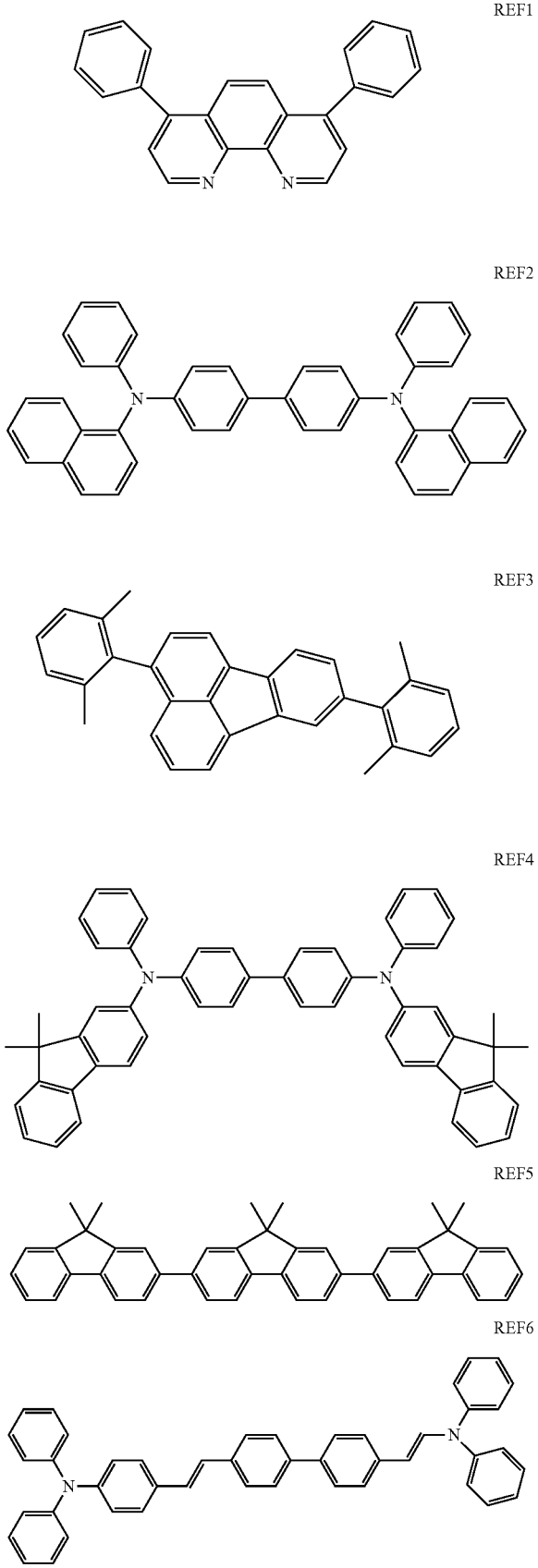

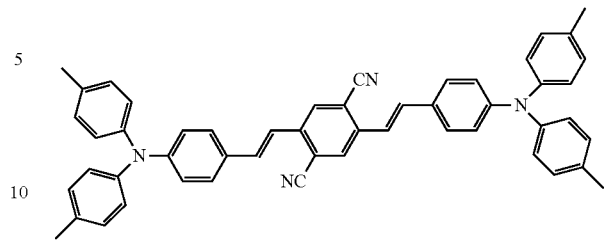

As light emitting layer dopants in Examples and Comparative Examples, dopants described in the following Table 3 were employed.

TABLE 3

| | Light emitting layer dopant A | Light emitting layer dopant B | Light emitting layer dopant C |
|---|---|---|---|
| Example 1 | GD7 | RD6 | BD6 |
| Example 2 | GD7 | RD6 | BD6 |
| Example 3 | GD21 | RD6 | BD6 |
| Example 4 | GD7 | RD20 | BD6 |
| Example 5 | GD7 | RD20 | BD17 |
| Example 6 | GD21 | RD20 | BD20 |
| Example 7 | GD7 | RD6 | BD6 |
| Example 8 | GD7 | RD6 | BD17 |
| Example 9 | GD19 | RD16 | BD6 |
| Example 10 | GD19 | RD16 | BD8 |
| Comparative Example 1 | GD7 | RD6 | BD6 |
| Comparative Example 2 | | | |
| Comparative Example 3 | GD7 | RD6 | BD6 |
| Comparative Example 4 | GD7 | RD6 | REF6 |
| Comparative Example 5 | GD7 | REF7 | BD17 |

The organic light emitting devices produced were subjected to the following two evaluations. The results are described in Table 4.

Evaluation of Ratio of Non-Emitting Pixels

A current was applied to each pixel at a current density of 10 mA/cm$^2$, and the ratio of non-emitting pixels to the provided pixels was determined and evaluated in accordance with the following grading system. When the ratio was less than 5%, the organic light emitting device was evaluated as "AAA"; when the ratio was 5% or more and less than 10%, the organic light emitting device was evaluated as "AA"; when the ratio was 10% or more and less than 50%, the organic light emitting device was evaluated as "A"; and when the ratio was 50% or more, the organic light emitting device was evaluated as B.

Evaluation of Durability of Devices

To G pixels, a current was continuously applied at a current density of 50 mA/cm$^2$ for 100 hours, and a luminance deterioration ratio relative to the initial luminance was determined and evaluated in accordance with the following grading system. When the ratio was less than 5%, the organic light emitting device was evaluated as "A"; when the ratio was 5% or more and less than 20%, the organic light emitting device was evaluated as "B"; and when the ratio was 20% or more, the organic light emitting device was evaluated as "C". The results are described in the following Table 4. In Table 4, symbols "-" mean that the devices had so many non-emitting pixels that the devices were not sufficiently evaluated in terms of durability.

Organic light emitting devices are desirably evaluated as A or better in terms of both of the ratio of non-emitting pixels and durability of devices.

TABLE 4

| | | |
|---|---|---|
| Example 1 | Ratio of non-emitting pixels | A |
| | Durability of device | A |
| Example 2 | Ratio of non-emitting pixels | A |
| | Durability of device | A |
| Example 3 | Ratio of non-emitting pixels | A |
| | Durability of device | A |
| Example 4 | Ratio of non-emitting pixels | A |
| | Durability of device | A |
| Example 5 | Ratio of non-emitting pixels | A |
| | Durability of device | A |
| Example 6 | Ratio of non-emitting pixels | A |
| | Durability of device | A |
| Example 7 | Ratio of non-emitting pixels | AA |
| | Durability of device | A |
| Example 8 | Ratio of non-emitting pixels | AA |
| | Durability of device | A |
| Example 9 | Ratio of non-emitting pixels | AAA |
| | Durability of device | A |
| Example 10 | Ratio of non-emitting pixels | AAA |
| | Durability of device | A |
| Comparative Example 1 | Ratio of non-emitting pixels | C |
| | Durability of device | — |
| Comparative Example 2 | Ratio of non-emitting pixels | C |
| | Durability of device | — |
| Comparative Example 3 | Ratio of non-emitting pixels | B |
| | Durability of device | C |
| Comparative Example 4 | Ratio of non-emitting pixels | A |
| | Durability of device | C |
| Comparative Example 5 | Ratio of non-emitting pixels | A |
| | Durability of device | C |

Example 11

A device was produced as in Example 1 except that the configuration and compounds of the organic layers in Example 1 were changed as described in the following Table 5.

TABLE 5

| | Materials | | | Thickness (nm) |
|---|---|---|---|---|
| Cathode | Mg:Ag = 1:1 | | | 10 |
| Electron injection layer | LiF | | | 1 |
| Electron transport layer | ET1 | | | 30 |
| Hole blocking layer | ET8 | | | 70 |
| Light emitting layer 3 | Host C | EMH1 | Weight ratio EMH1:BD6 = 99.4:0.6 | 10 |
| | Dopant C | BD6 | | |
| Light emitting layer 2 | Host B | EMH1 | Weight ratio EMH1:GD6 = 99.4:0.6 | 8 |
| | Dopant B | GD6 | | |
| Light emitting layer 1 | Host A | EMH1 | Weight ratio EMH1:RD6 = 99.6:0.4 | 8 |
| | Dopant A | RD6 | | |
| Hole transport layer | HT4 | | | 25 |
| Hole injection layer | HATCN | | | 7 |

Examples 12 to 15 and Comparative Examples 6 to 8

Devices were produced as in Example 11 except that the compounds of the organic layers in Example 11 were changed to compounds described in the following Tables 6 and 7. The glass transition temperatures of the compounds were measured as in the above-described Examples.

TABLE 6

| | Hole transport layer | Light emitting layer 1 Host A | Light emitting layer 2 Host B | Light emitting layer 3 Host C | Hole blocking layer | Electron transport layer | Layer having the lowest Tg |
|---|---|---|---|---|---|---|---|
| Example 11 | HT4 | EMH1 | EMH1 | EMH1 | ET8 | ET1 | ET1 |
| Tg (° C.) | 140 | 165 | 165 | 165 | 160 | 130 | 130 |
| Example 12 | HT4 | EMH3 | EMH3 | EMH3 | ET9 | ET2 | EMH3 |
| Tg (° C.) | 140 | 130 | 130 | 130 | 136 | 168 | 130 |
| Example 13 | HT4 | EMH24 | EMH22 | EMH22 | ET15 | ET2 | EMH24 |
| Tg (° C.) | 140 | 137 | 166 | 166 | 208 | 168 | 137 |
| Example 14 | HT4 | EMH26 | EMH7 | EMH7 | ET15 | ET2 | HT4 EMH26 |
| Tg (° C.) | 140 | 140 | 146 | 146 | 208 | 168 | 140 |
| Example 15 | HT1 | EMH8 | EMH8 | EMH8 | ET8 | ET2 | EMH8 |
| Tg (° C.) | 184 | 153 | 153 | 153 | 160 | 168 | 153 |
| Comparative Example 6 | HT4 | EMH1 | EMH1 | EMH1 | REF3 | ET1 | REF3 |
| Tg (° C.) | 140 | 165 | 165 | 165 | 98 | 130 | 98 |
| Comparative Example 7 | HT4 | EMH3 | EMH3 | EMH3 | REF5 | ET1 | EMH3 |
| Tg (° C.) | 140 | 130 | 130 | 130 | 121 | 130 | 121 |
| Comparative Example 8 | HT4 | EMH24 | EMH22 | EMH22 | ET15 | ET1 | EMH24 |
| Tg (° C.) | 140 | 137 | 166 | 166 | 208 | 130 | 137 |

As light emitting layer dopants in Examples and Comparative Examples, dopants described in the following Table 7 were employed.

TABLE 7

|  | Light emitting layer dopant A | Light emitting layer dopant B | Light emitting layer dopant C |
|---|---|---|---|
| Example 11 | RD6 | GD6 | BD6 |
| Example 12 | RD6 | GD7 | BD6 |
| Example 13 | RD6 | GD7 | BD8 |
| Example 14 | RD21 | GD22 | BD6 |
| Example 15 | RD9 | GD22 | BD1 |
| Comparative Example 6 | RD6 | GD6 | BD6 |
| Comparative Example 7 | RD6 | GD7 | BD6 |
| Comparative Example 8 | REF7 | GD7 | REF6 |

The organic light emitting devices produced were also subjected to the above-described two evaluations. The results are described in Table 8.

TABLE 8

| Example 11 | Ratio of non-emitting pixels | A |
|---|---|---|
|  | Durability of device | A |
| Example 12 | Ratio of non-emitting pixels | A |
|  | Durability of device | A |
| Example 13 | Ratio of non-emitting pixels | A |
|  | Durability of device | A |
| Example 14 | Ratio of non-emitting pixels | AA |
|  | Durability of device | A |
| Example 15 | Ratio of non-emitting pixels | AAA |
|  | Durability of device | A |
| Comparative Example 6 | Ratio of non-emitting pixels | C |
|  | Durability of device | — |
| Comparative Example 7 | Ratio of non-emitting pixels | B |
|  | Durability of device | C |
| Comparative Example 8 | Ratio of non-emitting pixels | A |
|  | Durability of device | C |

The above-described evaluation results have demonstrated that, in such an organic light emitting device, materials individually accounting for 50 wt % or more of a hole transport layer, a light emitting layer, and an electron transport layer desirably have glass transition temperatures of 130° C. or more. In this case, the layers are not affected by annealing in the color filter formation step, so that the layers do not undergo morphological changes such as crystallization and are maintained as stable amorphous films. Thus, the device exhibits good light emitting characteristics.

In addition, the device is provided such that the layers do not include the vinylene group represented by the general formula [1]. As a result, the layers are not affected by irradiation with light during the color filter formation step. Thus, the layers maintain the chemical structures. The layers thus maintain the chemical structures, to thereby exhibit good light emitting characteristics and durability characteristics.

An embodiment of the present disclosure provides an organic light emitting device that includes an organic compound layer having a glass transition temperature of 130° C. or more and not including a specified chemical structure, so that the organic light emitting device has good device characteristics even in spite of having been subjected to an on-chip color filter formation step.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-217566, filed Nov. 20, 2018, which is hereby incorporated by reference herein in its entirety.

What is claimed is:

1. An organic light emitting device comprising:
   a pair of electrodes; and
   an organic compound layer disposed between the pair of electrodes, wherein the organic compound layer contains, in a weight ratio of 50 wt % or more, an organic compound having a glass transition temperature of 130° C. or more, and the organic compound does not have a vinylene group as a moiety.

2. The organic light emitting device according to claim 1, wherein the organic compound layer includes a plurality of layers, and all organic compounds individually contained, in weight ratios of 50 wt % or more, in the plurality of layers have glass transition temperatures of 130° C. or more.

3. The organic light emitting device according to claim 2, wherein all the organic compounds individually contained, in weight ratios of 50 wt % or more, in the plurality of layers have glass transition temperatures of 140° C. or more.

4. The organic light emitting device according to claim 3, wherein all the organic compounds individually contained, in weight ratios of 50 wt % or more, in the plurality of layers have glass transition temperatures of 150° C. or more.

5. The organic light emitting device according to claim 1, wherein the organic compound layer includes a light emitting layer, and the light emitting layer contains, in a weight ratio of 50 wt % or more, an organic compound having a glass transition temperature of 140° C. or more.

6. The organic light emitting device according to claim 5, wherein the light emitting layer contains, in a weight ratio of less than 50 wt %, an organic compound having a glass transition temperature of 135° C. or more.

7. The organic light emitting device according to claim 5, wherein the organic compound layer includes a charge transport layer in contact with the light emitting layer, and the charge transport layer contains, in a weight ratio of 50 wt % or more, an organic compound having a glass transition temperature of 135° C. or more.

8. The organic light emitting device according to claim 5, wherein the light emitting layer is formed of a material composed of an aromatic hydrocarbon.

9. The organic light emitting device according to claim 1, wherein the organic compound layer includes a plurality of layers, and, of the plurality of layers, a layer having the largest thickness contains, in a weight ratio of 50 wt % or more, an organic compound having a glass transition temperature of 135° C. or more.

10. The organic light emitting device according to claim 1 comprising an on-chip color filter.

11. The organic light emitting device according to claim 10, wherein the organic compound layer is an amorphous film.

12. The organic light emitting device according to claim 1, further comprising an inorganic layer, a first resin layer, a color filter, and a second resin layer stacked in this order, wherein the first resin layer has a smaller thickness than the second resin layer.

13. A display apparatus comprising a plurality of pixels, wherein the plurality of pixels include the organic light emitting device according to claim 1 and a transistor connected to the organic light emitting device.

14. A photoelectric conversion apparatus comprising:
an optical unit including a plurality of lenses;
an image pickup device configured to receive light having passed through the optical unit; and
a display unit configured to display an image captured with the image pickup device,
wherein the display unit includes the organic light emitting device according to claim 1.

15. An electronic apparatus comprising:
a display unit including the organic light emitting device according to claim 1;
a housing provided with the display unit; and
a communication unit provided in the housing and configured to communicate with an external device.

16. An illumination apparatus comprising:
a light source including the organic light emitting device according to claim 1; and
a light diffusion unit or optical film configured to transmit light emitted from the light source.

17. A moving object comprising:
an illumination unit including the organic light emitting device according to claim 1; and
a body provided with the illumination unit.

* * * * *